(12) United States Patent
Manassen et al.

(10) Patent No.: US 12,422,363 B2
(45) Date of Patent: Sep. 23, 2025

(54) SCANNING SCATTEROMETRY OVERLAY METROLOGY

(71) Applicant: KLA Corporation, Milpitas, CA (US)

(72) Inventors: Amnon Manassen, Haifa (IL); Andrew V. Hill, Berkeley, CA (US); Yuri Paskover, Milpitas, CA (US); Itay Gdor, Tel-Aviv (IL); Yonatan Vaknin, Yoqneam Llit (IL); Yuval Lubashevsky, Haifa (IL)

(73) Assignee: KLA Corporation, Milpitas, CA (US)

( * ) Notice: Subject to any disclaimer, the term of this patent is extended or adjusted under 35 U.S.C. 154(b) by 682 days.

(21) Appl. No.: 17/708,958

(22) Filed: Mar. 30, 2022

(65) Prior Publication Data

US 2023/0314319 A1    Oct. 5, 2023

(51) Int. Cl.
*G01N 21/47* (2006.01)
*G01B 11/27* (2006.01)
*G01N 21/956* (2006.01)

(52) U.S. Cl.
CPC ....... *G01N 21/4788* (2013.01); *G01B 11/272* (2013.01); *G01N 21/956* (2013.01); *G01B 2210/56* (2013.01)

(58) Field of Classification Search
CPC ............. G01N 21/4788; G01N 21/956; G01B 11/272; G01B 2210/56; G03F 7/70683; G03F 7/706851; G03F 7/70633; G03F 7/706837; G03F 7/706847
See application file for complete search history.

(56) References Cited

U.S. PATENT DOCUMENTS

| | | | |
|---|---|---|---|
| 4,947,413 | A | 8/1990 | Jewell et al. |
| 5,216,257 | A | 6/1993 | Brueck et al. |
| 5,414,514 | A | 5/1995 | Smith et al. |
| 5,808,731 | A | 9/1998 | Kirk |
| 5,895,735 | A | 4/1999 | Yoon |
| 5,914,204 | A | 6/1999 | Lee |
| 6,958,819 | B1 | 10/2005 | Heaton et al. |
| 7,247,843 | B1 | 7/2007 | Moon |

(Continued)

FOREIGN PATENT DOCUMENTS

| CN | 104346808 A | 2/2015 |
|---|---|---|
| CN | 111766764 A | 10/2020 |

(Continued)

OTHER PUBLICATIONS

U.S. Appl. No. 17/709,104, filed Mar. 30, 2022, Lubashevksy et al.

(Continued)

*Primary Examiner* — Rebecca C Bryant
(74) *Attorney, Agent, or Firm* — Suiter Swantz IP

(57) ABSTRACT

An overlay metrology system may include an illumination an illumination source to generate an illumination beam, one or more illumination optics to direct the illumination beam to an overlay target on a sample as the sample is scanned relative to the illumination beam along a scan direction, the target including one or more cells having Moiré structures. The system may also include two photodetectors at locations of a pupil plane associated with Moiré or overlapping diffraction orders from the Moiré structures. The system may then generate overlay measurements based on time-varying interference signals captured by the detector as the sample is scanned.

51 Claims, 17 Drawing Sheets

(56) References Cited

U.S. PATENT DOCUMENTS

| | | | |
|---|---|---|---|
| 7,440,105 | B2 | 10/2008 | Adel et al. |
| 7,602,491 | B2 | 10/2009 | Kandel et al. |
| 7,671,990 | B1 | 3/2010 | Adel et al. |
| 8,786,825 | B2 | 7/2014 | Kerkhof et al. |
| 9,123,649 | B1 | 9/2015 | Manassen et al. |
| 9,864,209 | B2 | 1/2018 | Levinski et al. |
| 9,885,961 | B1 | 2/2018 | Amir |
| 10,197,389 | B2 | 2/2019 | Levinski et al. |
| 10,268,125 | B2 | 4/2019 | Peng et al. |
| 10,437,163 | B2 | 10/2019 | Schaar et al. |
| 10,488,768 | B2 | 11/2019 | Auer et al. |
| 10,527,952 | B2 | 1/2020 | Grunzweig et al. |
| 10,585,357 | B2 | 3/2020 | Schaar et al. |
| 10,606,178 | B2 | 3/2020 | Zwier |
| 10,691,030 | B2 | 6/2020 | Staals et al. |
| 10,824,079 | B2 | 11/2020 | Lubashevsky et al. |
| 10,983,005 | B2 | 4/2021 | Wu et al. |
| 11,073,768 | B2 | 7/2021 | Hill et al. |
| 11,112,369 | B2 | 9/2021 | Gready |
| 11,119,417 | B2 | 9/2021 | Manassen et al. |
| 11,164,307 | B1 | 11/2021 | Feler et al. |
| 11,300,405 | B2 | 4/2022 | Manassen et al. |
| 11,300,524 | B1 | 4/2022 | Hill et al. |
| 11,353,799 | B1 | 6/2022 | Volkovich et al. |
| 11,378,394 | B1 | 7/2022 | Paskover et al. |
| 11,428,642 | B2 | 8/2022 | Hill et al. |
| 11,526,086 | B2 | 12/2022 | Hill et al. |
| 11,604,149 | B2 | 3/2023 | Feler |
| 11,796,925 | B2 | 10/2023 | Lubashevsky et al. |
| 2001/0021477 | A1 | 9/2001 | Dirksen et al. |
| 2002/0080364 | A1 | 6/2002 | Monshouwer et al. |
| 2004/0169861 | A1 | 9/2004 | Mieher et al. |
| 2005/0018190 | A1 | 1/2005 | Sezginer et al. |
| 2005/0195398 | A1 | 9/2005 | Adel et al. |
| 2007/0077503 | A1 | 4/2007 | Yoo |
| 2007/0234786 | A1 | 10/2007 | Moon |
| 2007/0242272 | A1 | 10/2007 | Suehira et al. |
| 2007/0279630 | A1 | 12/2007 | Kandel et al. |
| 2009/0042108 | A1 | 2/2009 | Yasuzato |
| 2010/0267682 | A1 | 10/2010 | Johri et al. |
| 2010/0277706 | A1 | 11/2010 | Schaar et al. |
| 2011/0122496 | A1 | 5/2011 | Schaar et al. |
| 2012/0033193 | A1 | 2/2012 | Schaar et al. |
| 2012/0253325 | A1 | 10/2012 | Sniffin et al. |
| 2013/0032712 | A1 | 2/2013 | Shih et al. |
| 2013/0193602 | A1 | 8/2013 | Suzuki et al. |
| 2013/0252429 | A1 | 9/2013 | Okamoto et al. |
| 2013/0300999 | A1 | 11/2013 | DeJong et al. |
| 2014/0065736 | A1 | 3/2014 | Amir et al. |
| 2014/0240704 | A1 | 8/2014 | Komine et al. |
| 2015/0138523 | A1 | 5/2015 | Jak et al. |
| 2015/0177135 | A1 | 6/2015 | Amit et al. |
| 2015/0235880 | A1 | 8/2015 | Inada et al. |
| 2015/0293458 | A1 | 10/2015 | Vanoppen et al. |
| 2016/0047744 | A1 | 2/2016 | Adel et al. |
| 2016/0093574 | A1 | 3/2016 | Cai et al. |
| 2016/0146740 | A1 | 5/2016 | Lu et al. |
| 2016/0223920 | A1 | 8/2016 | Tinnemans et al. |
| 2016/0300767 | A1 | 10/2016 | Ko et al. |
| 2017/0146338 | A1 | 5/2017 | Allen |
| 2017/0307367 | A1 | 10/2017 | Yaegashi et al. |
| 2017/0351184 | A1 | 12/2017 | Peng et al. |
| 2018/0024054 | A1 | 1/2018 | Moon et al. |
| 2018/0246420 | A1 | 8/2018 | Pandey et al. |
| 2019/0004439 | A1 | 1/2019 | Lubashevsky et al. |
| 2019/0033726 | A1 | 1/2019 | Adam et al. |
| 2019/0049373 | A1 | 2/2019 | Levinski |
| 2019/0101835 | A1 | 4/2019 | Chen |
| 2019/0219931 | A1 | 7/2019 | Zwier |
| 2019/0285407 | A1 | 9/2019 | Chuang et al. |
| 2019/0285996 | A1 | 9/2019 | Shibayama et al. |
| 2019/0354024 | A1 | 11/2019 | Tsiatmas et al. |
| 2020/0132446 | A1 | 4/2020 | Shalibo et al. |
| 2020/0241429 | A1 | 7/2020 | Yang et al. |
| 2021/0072650 | A1 | 3/2021 | Feler et al. |
| 2021/0364279 | A1 | 11/2021 | Manassen et al. |
| 2021/0364935 | A1 | 11/2021 | Gdor et al. |
| 2022/0034652 | A1 | 2/2022 | Manassen et al. |
| 2022/0252990 | A1 | 8/2022 | Javaheri et al. |
| 2023/0133640 | A1 | 5/2023 | Hill et al. |
| 2023/0213875 | A1 | 7/2023 | Lubashevsky et al. |
| 2023/0314344 | A1 | 10/2023 | Paskover et al. |
| 2024/0068804 | A1 | 2/2024 | Lubashevsky et al. |
| 2024/0167813 | A1 | 5/2024 | Gdor et al. |
| 2024/0280914 | A1 | 8/2024 | Manassen et al. |
| 2024/0302751 | A1 | 9/2024 | Pio et al. |
| 2024/0337952 | A1 | 10/2024 | Gdor et al. |
| 2024/0337953 | A1 | 10/2024 | Gdor et al. |

FOREIGN PATENT DOCUMENTS

| | | |
|---|---|---|
| JP | 214765 Y1 | 8/1998 |
| JP | 10214765 A | 11/1998 |
| JP | 2001093820 A | 4/2001 |
| JP | 2002134394 A | 5/2002 |
| JP | 2004006895 A | 1/2004 |
| JP | 2007140460 | 2/2009 |
| JP | 2010267682 A | 11/2010 |
| JP | 2011243664 A | 12/2011 |
| JP | 2012253325 A | 12/2012 |
| JP | 2013074258 A | 4/2013 |
| JP | 2013254780 | 7/2015 |
| JP | 2015154008 A | 8/2015 |
| KR | 101185992 B1 | 9/2012 |
| KR | 20150121275 A | 10/2015 |
| KR | 1020160121206 A | 10/2016 |
| KR | 1020230128002 A | 9/2023 |
| WO | 2022020402 A1 | 1/2022 |
| WO | 2022031565 A1 | 2/2022 |

OTHER PUBLICATIONS

Buttgereit, et al., "Phame(R)—high resolution off-axis phase shift measurements on 45nm node features, " 24th European Mask and Lithography Conference, 2008, pp. 1-7, doi: 10.1117/12.798805.

Di, et al., "Moiré-Based Absolute Interferometry With Large Measurement Range in Wafer-Mask Alignment", IEEE Photonics Technology Letters, vol. 27, No. 4, pp. 435-438, 2015. doi:10.1109/LPT.2014.2377037.

Fesperman Jr., Ronnie Rex, (2006). Multiscale Alignment and Positioning System. (UMI 3264369) [Doctor of Philosophy, University of North Carolina] ProQuest Information and Learning Company.

Kikuchi et al., "Principle and observation of fluorescence moire fringes for alignment in print and imprint methods" J. Vac. Sci. Technol. B 35, 06G303 (2017); https://doi.org/10.1116/1.4990844, Submitted: Jun. 19, 2017 . Accepted: Aug. 31, 2017 . Published Online: Sep. 26, 2017.

Moon, et al., "Immunity to Signal Degradation by Overlayers Using a Novel Spatial-Phase-Matching Alignment System", J. Vac. Sci. Technol. B 13, 2648-2652 (1995).

Servin, et al., "Mask contribution on CD & OVL errors budgets for Double Patterning Lithography," 25th European Mask and Lithography Conference, 2009, pp. 1-13.

Wu, et al., (2012). Nanoimprint lithography with ≤60 nm overlay precision. Applied Physics A, 106, 767-772.

Zhou, et al., (2015). Moiré-Based Interferometry for Magnification Calibration of Bitelecentric Lens System. IEEE Photonics Journal. 7. 1-11. 10.1109/JPHOT.2015.2500892.

Zhou, et al., "Fourier-based analysis of moiré fringe patterns of superposed gratings in alignment of nanolithography", Optics Express, vol. 16, No. 11, p. 7869, 2008. doi:10.1364/OE.16.007869.

Zhu et al. Four-quadrant gratings moiré fringe alignment measurement in proximity lithography. Optics Express. Feb. 2013;21(3):3463-3473. DOI: 10.1364/oe.21.003463. PMID: 23481804.

Zhu, et al., (2015). Adjustment Strategy for Inclination Moiré Fringes in Lithography by Spatial Frequency Decomposition. IEEE Photonics Technology Letters. 27. 395-398. 10.1109/LPT.2014.2370072.

(56) References Cited

OTHER PUBLICATIONS

Zhou et al., "Moiré-Based Interferometry for Magnification Calibration of Bitelecentric Lens System," IEEE Photonics Journal, vol. 7, No. 6, Dec. 2015, 12 pages.
Korean Intellectual Property Office, International Search Report and Written Opinion for International Application No. PCT/US2023/013654, Jun. 8, 2023, 12 pages.
Korean Intellectual Property Office, International Search Report and Written Opinion for International Application No. PCT/US2023/014005, Jun. 16, 2023, 8 pages.
Korean Intellectual Property Office, International Search Report and Written Opinion for International Application No. PCT/US2022/052061, Apr. 24, 2023, 10 pages.
U.S. Appl. No. 17/119,536, filed Dec. 11, 2020, Paskover et al.
U.S. Appl. No. 17/140,999, filed Jan. 4, 2021, Hill et al.
U.S. Appl. No. 17/142,783, filed Jan. 6, 2021, Hill et al.
Adel, Mike et al., "Diffraction order control in overlay metrology: a review of the roadmap options," Proc. SPIE. 6922, Metrology, Inspection, and Process Control for Microlithography XXII, 692202 (2008).
U.S. Appl. No. 18/099,798, filed Jan. 20, 2023, Itay Gdor.
U.S. Appl. No. 18/110,746, filed Feb. 16, 2023, Amnon Manassen.
U.S. Appl. No. 18/230,542, filed Aug. 4, 2023, Jordan Pio.
U.S. Appl. No. 18/234,773, filed Aug. 16, 2023, Yuval Lubashevsky.
U.S. Appl. No. 18/372,444, filed Sep. 25, 2023, Itay Gdor.
U.S. Appl. No. 18/372,531, filed Sep. 25, 2023, Itay Gdor.
Adel et al., "Diffraction order control in overlay metrology: a review of the roadmap options," Proc. SPIE. 6922, Metrology, Inspection, and Process Control for Microlithography XXII, pp. 692202-1 to 692202-19, Apr. 2008.
International Search Report and Written Report in International Application No. PCT/US2021/061296 dated Mar. 24, 2022, 9 pages.
PCT International Search Report and Written Opinion for International Application No. PCT/US2021/044111 dated Nov. 22, 2022, 9 pages.
European Patent Office, Extended European Search Report received in EP Application No. 23781547.7, Feb. 3, 2025, 13 pages.
Korean Intellectual Property Office, International Search Report and Written Opinion received in International Application No. PCT/US2025/022844, Jul. 22, 2025, 8 pages.
European Patent Office, Extended European Search Report received in EP Application No. 23781550.1, Jul. 10, 2025, 8 pages.

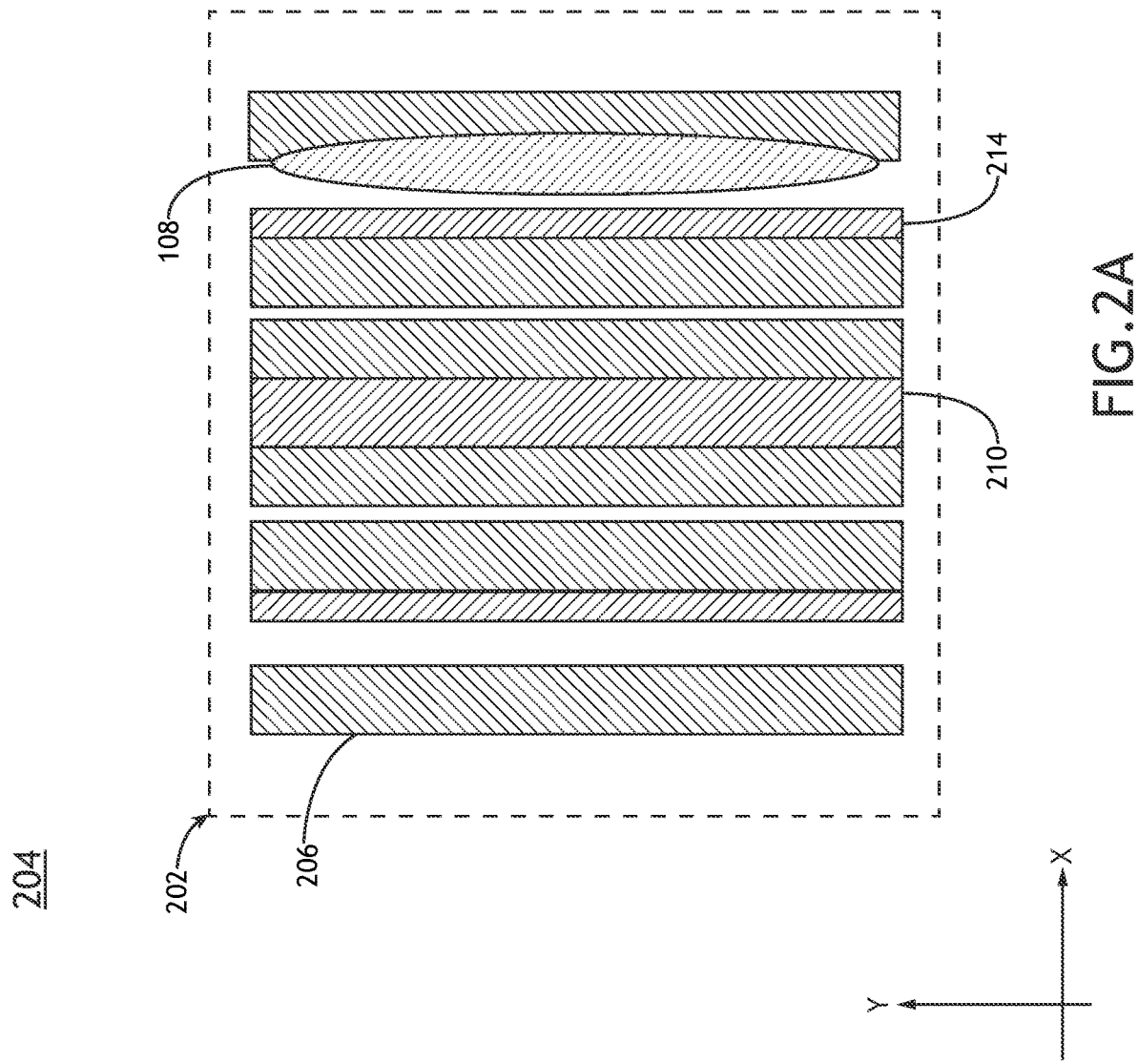

SCANNING SCATTEROMETRY OVERLAY METROLOGY

TECHNICAL FIELD

The present disclosure relates generally to overlay metrology and, more particularly, to scanning scatterometry overlay metrology.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features on two or more sample layers. In a general sense, proper alignment of fabricated features on multiple sample layers is necessary for proper functioning of the device.

Demands to decrease feature size and increase feature density are resulting in correspondingly increased demand for accurate and efficient overlay metrology. Metrology systems typically generate metrology data associated with a sample by measuring or otherwise inspecting dedicated metrology targets distributed across the sample. Accordingly, the sample is typically mounted on a translation stage and translated such that the metrology targets are sequentially moved into a measurement field of view. In typical metrology systems employing a move and measure (MAM) approach, the sample is static during each measurement. However, the time required for the translation stage to settle prior to a measurement may negatively impact the throughput. Therefore, it is desirable to provide systems and methods for curing the above deficiencies.

SUMMARY

An overlay metrology system is disclosed in accordance with one or more illustrative embodiments of the present disclosure. In one illustrative embodiment, the system includes an illumination sub-system with an illumination source to generate an illumination beam and one or more illumination optics to direct the illumination beam to an overlay target on a sample as the sample is scanned relative to the illumination beam along a scan direction when implementing a metrology recipe. In another illustrative embodiment, the overlay target, in accordance with the metrology recipe, includes one or more cells having Moiré structures formed as overlapping grating structures with different pitches, and where the overlapping grating structures are periodic along at least one of the scan direction or a direction orthogonal to the scan direction. In another illustrative embodiment, the system includes a collection sub-system with a first photodetector located in a pupil plane at a first location to capture at least one of Moiré diffraction orders or overlapping diffraction orders from the Moiré structures in the one or more cells when implementing the metrology recipe, and a second photodetector located in the pupil plane at a second location to capture at least one of Moiré diffraction orders or overlapping diffraction orders from the Moiré structures in the one or more cells when implementing the metrology recipe. In another illustrative embodiment, the system includes a controller to receive time-varying interference signals from the first and second photodetectors associated with the Moiré structures in the one or more cells as the overlay target is scanned in accordance with the metrology recipe, and to determine an overlay error between the first and second layers of the sample based on the time-varying interference signals.

An overlay metrology system is disclosed in accordance with one or more illustrative embodiments of the present disclosure. In one illustrative embodiment, the system includes an illumination sub-system with a first illumination channel and a second illumination channel for illuminating an overlay target on a sample as the sample is scanned along a stage-scan direction by a translation stage when implementing a metrology recipe. In another illustrative embodiment, the overlay target, in accordance with the metrology recipe, includes a first set of cells including Moiré structures formed as overlapping grating structures with different pitches along a first direction, and a second set of cells including Moiré structures formed as overlapping grating structures with different pitches along a second direction orthogonal to the first direction, where the stage-scan direction is angled with respect to the first direction and second direction. In another illustrative embodiment, the first and second illumination channels illuminate different cells of the overlay target separated along a direction orthogonal to the stage-scan direction. In another illustrative embodiment, the system includes a collection sub-system with a first detection channel and a second detection channel associated with the first illumination channel and the second illumination channel, respectively. In another illustrative embodiment, a particular detection channel includes a first photodetector located in a pupil plane at a first location to capture at least one of Moiré diffraction orders or overlapping diffraction orders from the Moiré structures in the one or more cells when implementing the metrology recipe, and a second photodetector located in a pupil plane at a second location to capture at least one of Moiré diffraction orders or overlapping diffraction orders from the Moiré structures in the one or more cells when implementing the metrology recipe. In another illustrative embodiment, the system includes a controller to receive time-varying interference signals from the first and second photodetectors of each of the first and second detection channels as the overlay target is scanned in accordance with the metrology recipe, and to determine an overlay error between the first and second layers of the sample based on the time-varying interference signals.

An overlay metrology system is disclosed in accordance with one or more illustrative embodiments of the present disclosure. In one illustrative embodiment, the system includes an illumination sub-system with an illumination source to generate an illumination beam. In another illustrative embodiment, the illumination sub-system also includes a scan mirror to scan the illumination beam along a beam-scan direction across an overlay target on a sample as the sample is translated along a stage-scan direction orthogonal to the beam-scan direction by a translation stage when implementing a metrology recipe. In another illustrative embodiment, the overlay target, in accordance with the metrology recipe, includes one or more cells having Moiré structures formed as overlapping grating structures with different pitches, where the overlapping grating structures are periodic along at least one of the scan direction or a direction orthogonal to the stage-scan direction, and where the one or more cells are distributed along a diagonal direction angled with respect to the stage-scan direction. In another illustrative embodiment, the system includes a collection sub-system with a first photodetector located in a pupil plane at a first location to capture at least one of Moiré diffraction orders or overlapping diffraction orders from the Moiré structures in the one or more cells when implementing the metrology recipe, and a second photodetector located in a pupil plane at a second location to capture at least one of Moiré diffraction orders or overlapping diffraction orders from the Moiré structures in the one or more cells when implementing the metrology recipe. In another illustrative embodiment, the system includes a controller to receive time-varying interference signals from the first and second photodetectors as the overlay target is scanned when implementing the metrology recipe, and to determine an overlay error between the first and second layers of the sample based on the time-varying interference signals.

An overlay metrology system is disclosed in accordance with one or more illustrative embodiments of the present disclosure. In one illustrative embodiment, the system includes an illumination sub-system with a first illumination channel providing a first illumination beam, a second illumination channel providing a second illumination beam, and one or more beam-scanners to scan the first and second illumination beams across portions of an overlay target on a sample along a beam-scan direction as the sample is scanned along a stage-scan direction using a translation stage when implementing a metrology recipe. In another illustrative embodiment, the overlay target, in accordance with the metrology recipe, includes a first set of cells including Moiré structures formed as overlapping grating structures with different pitches along the stage-scan direction, and a second set of cells including Moiré structures formed as overlapping grating structures with different pitches along the beam-scan direction. In another illustrative embodiment, the first and second illumination channels illuminate different cells of the overlay target separated along the beam-scan direction. In another illustrative embodiment, the system includes a collection sub-system with a first detection channel and a second detection channel associated with the first illumination channel and the second illumination channel, respectively. In another illustrative embodiment, a particular detection channel includes a first photodetector located in a pupil plane at a first location to capture at least one of Moiré diffraction orders or overlapping diffraction orders from the Moiré structures in the one or more cells when implementing the metrology recipe, and a second photodetector located in a pupil plane at a second location to capture at least one of Moiré diffraction orders or overlapping diffraction orders from the Moiré structures in the one or more cells when implementing the metrology recipe. In another illustrative embodiment, the system includes a controller to receive time-varying interference signals from the first and second photodetectors of each of the first and second detection channels as the overlay target is scanned when implementing the metrology recipe, and to determine an overlay error between the first and second layers of the sample based on the time-varying interference signals.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 2A is a top view of a cell of an overlay target with a Moiré structure, in accordance with one or more embodiments of the present disclosure.

DETAILED DESCRIPTION

Figure 1A:
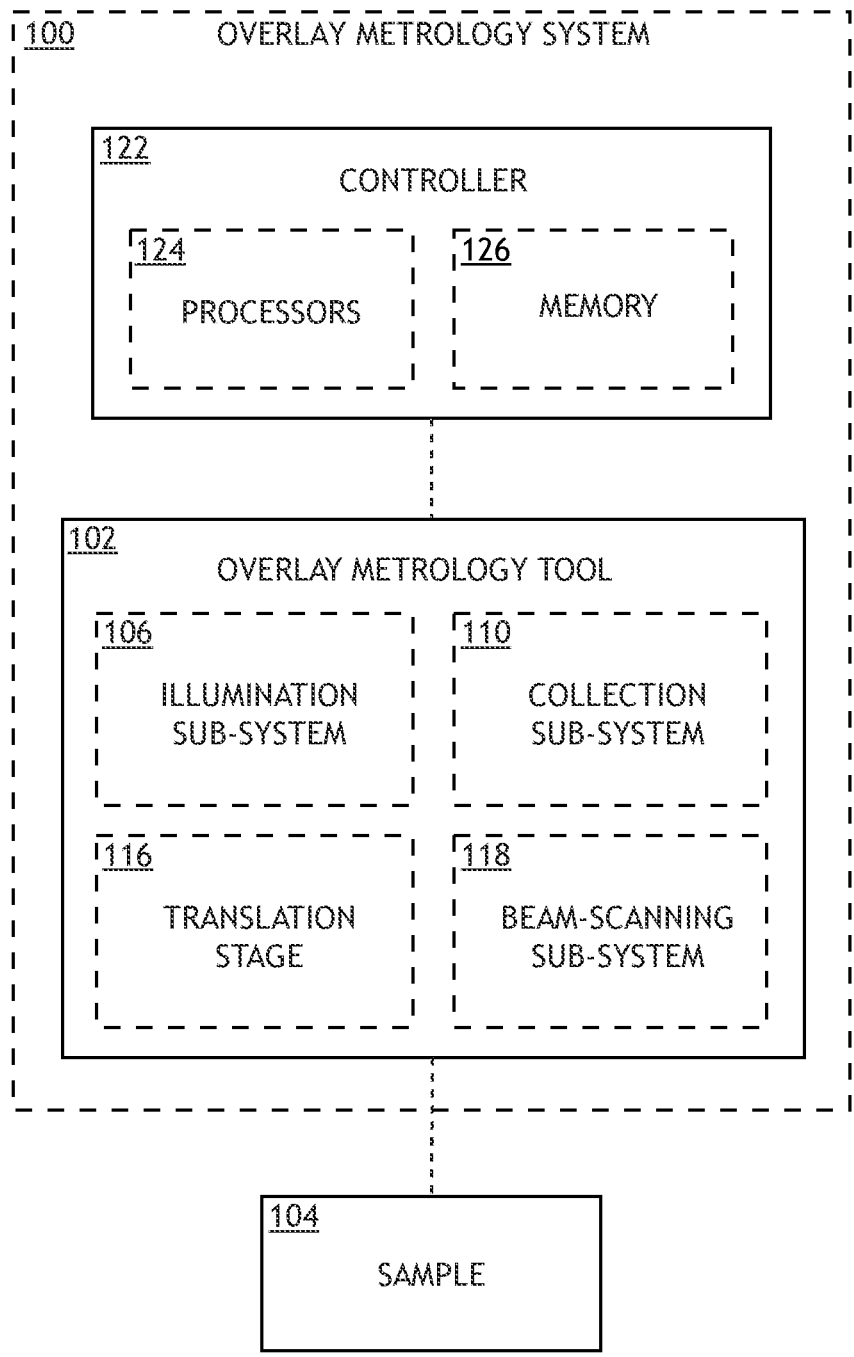
FIG. 1A is a conceptual view of a system for performing scatterometry overlay metrology on overlay targets with at least one Moiré structure, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to scanning scatterometry overlay using overlay targets including Moiré structures. For example, a Moiré structure may include a grating-over-grating structure in which the constituent gratings have different periods.

For the purposes of the present disclosure, the term scatterometry metrology is used to broadly encompass the terms scatterometry-based metrology and diffraction-based metrology in which a sample having periodic features on one or more sample layers is illuminated with an illumination beam having a limited angular extent and one or more distinct diffraction orders are collected for the measurement. Further, the term scanning metrology is used to describe metrology measurements generated when a sample is in motion relative to illumination used for a measurement. In a general sense, scanning metrology may be implemented by moving the sample, the illumination, or both.

It is contemplated herein that scatterometry overlay metrology is commonly performed using a scatterometry overlay target including one or more grating-over-grating structures formed as diffraction gratings with common pitches (e.g., periods) and directions of periodicity on two sample layers in an overlapping region. Various techniques for determining an overlay measurement with such scatterometry overlay targets are generally described in U.S. Patent Publication No. 2021/0364279 published on Nov. 25, 2021, U.S. Pat. No. 10,824,079 issued on Nov. 3, 2020, and U.S. Pat. No. 10,197,389 issued on Feb. 9, 2019, all of which are incorporated herein by reference in their entirety.

It is further contemplated herein that overlay targets including grating-over-grating structures in which the overlapping gratings have different pitches (herein referred to as Moiré structures) may take advantage of the Moiré effect in which a Moiré diffraction pattern is generated. This Moiré diffraction pattern may be related to overlay by a gain factor associated with a difference between the pitches of the constituent gratings. As a result, such overlay targets may provide highly sensitive overlay measurements. Overlay metrology using overlay targets with Moiré grating structures is generally described in U.S. Pat. No. 7,440,105 issued on Oct. 21, 2008, U.S. Pat. No. 11,164,307 issued on Nov. 2, 2021, U.S. Patent Publication No. 2021/0072650 published on Mar. 11, 2021, and U.S. Pat. No. 10,197,389 issued on Feb. 9, 2019, all of which are incorporated herein by reference in their entirety.

However, overlay targets including Moiré structure targets present additional measurement challenges relative to common-pitch grating-over-grating structures. Because the pitches of the constituent gratings of a Moiré structure are different, the physical offsets between individual lines of the constituent gratings vary across a cell. The apparent overlay (or apparent overlay error) observable using typical techniques thus varies based on the particular location of an illumination beam used to characterize the target. As a result, data associated with an extended portion of the cell is generally required to capture these position-dependent offsets and fully characterize the Moiré structure. While static image-based systems may capture these position-dependent differences in the apparent overlay (e.g., as a position-dependent phase) in a single image, they suffer from the typical throughput challenges described above. Further, static scatterometry-based systems utilizing an illumination beam smaller than the cell (e.g., underfilled illumination) may fail to capture the position-dependent differences in the apparent overlay across the entire Moiré structure.

Embodiments of the present disclosure are directed to systems and methods for scanning overlay metrology based on time-varying interference signals from Moiré structures in a collection pupil plane. It is contemplated herein that measurement conditions leading to overlapping diffraction orders or Moiré diffraction orders (e.g., combined diffraction, double diffraction, or the like) from the constituent gratings of a Moiré structure may lead to interference. Such interference signals may include information associated with asymmetries in the target structure such as, but not limited to, overlay between the top and bottom gratings. It is further contemplated herein that scanning the Moiré structure relative to an illumination beam (or vice versa) may provide characterization of the position-dependent overlay of the Moiré structure and may thus enable the determination of asymmetries such as, but not limited to, overlay.

Some embodiments of the present disclosure are directed to scanning scatterometry overlay metrology based on time-varying interference signals associated with overlapping diffraction lobes from top and bottom gratings of a Moiré structure or Moiré diffraction from the Moiré structure. Overlay measurements of common-pitch grating-over-grating structures based on time-varying interference signals in a collection pupil are generally described in U.S. Patent Publication No. 2022/0034652 published on Feb. 3, 2022, which is incorporated herein by reference in its entirety. In U.S. Patent Publication No. 2022/0034652, overlay measurements of the common-pitch grating-over-grating structures are generated based on a comparison of time-varying interference patterns in regions of overlap between zero-order diffraction and +/−1 diffraction orders generated during a scan and captured by photodetectors in these regions. It is contemplated herein that the systems and methods of U.S. Patent Publication No. 2022/0034652 may be extended or otherwise adapted to provide overlay measurements of Moiré structures. In this way, some embodiments of the present disclosure include extensions or adaptations of the systems and methods of U.S. Patent Publication No. 2022/0034652 to accommodate differences between common-pitch grating-over-grating structures and Moiré structures. However, the present disclosure is not limited to such extensions or adaptations of the systems and methods of U.S. Patent Publication No. 2022/0034652.

In some embodiments, an overlay metrology system includes photodetectors located in a pupil plane at positions corresponding to Moiré diffraction lobes from Moiré structures (e.g., double diffraction from the top and bottom gratings of Moiré structures). For example, photodetectors may be located at locations of overlap between Moiré diffraction lobes and 0-order diffraction (e.g., specular reflection). By way of another example, photodetectors may be located at locations including only Moiré diffraction lobes. It is contemplated herein that these combined diffraction orders will exhibit time-varying interference signals (e.g., AC signals) during a scanning measurement, which may be captured using the photodetectors. For example, the properties of the Moiré structures (e.g., pitches of the constituent gratings) and/or the measurement conditions (e.g., illumination wavelength, illumination incidence angle, collection angle, or the like) may be selected to provide that positive and negative Moiré diffraction orders associated with combined diffraction by the gratings of the Moiré structure (e.g., double diffraction orders) are collected by the system and captured by the photodetectors. It is contemplated herein that the pitches of the constituent gratings of a Moiré structure need not be resolved by the overlay system. Further, this configuration may enable Moiré structures with pitches similar to those present in device features on the sample, which may facilitate highly accurate overlay measurements and/or relatively small target sizes.

Some embodiments of the present disclosure are directed to providing recipes for configuring an overlay metrology tool. An overlay metrology tool is typically configurable according to a recipe including a set of parameters for controlling various aspects of an overlay measurement such as, but not limited to, the illumination of a sample, the collection of light from the sample, or the position of the sample during a measurement. In this way, the overlay metrology tool may be configured to provide a selected type of measurement for one or more overlay target designs of interest. For example, a metrology recipe may include illumination parameters such as, but not limited to, a number of illumination beams, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, wavelength filters, positions of one or more detectors (e.g., photodetectors) or parameters for controlling the one or more detectors. By way of a further example, a metrology recipe may include various parameters associated with the sample position during a measurement such as, but not limited to, a sample height, a sample orientation, whether a sample is static during a measurement, or whether a sample is in motion during a measurement (along with associated parameters describing the speed, scan pattern, or the like).

In some embodiments, the properties of the Moiré structures (e.g., pitches of the constituent gratings, or the like) and the measurement conditions (e.g., illumination wavelength, illumination incidence angle, collection angle, or the like) are arranged or otherwise selected (e.g., using a metrology recipe) to provide a selected distribution of Moiré diffraction and/or combined diffraction orders and to further provide that photodetectors are placed at suitable locations to capture these orders to generate time-varying interference signals of interest.

The systems and methods disclosed herein may be suitable for a wide variety of sample layouts including samples with relatively thin or relatively thick sample layers. For example, the systems and methods disclosed herein may be well suited for samples with relatively thin sample layers such as, but not limited to dynamic random-access memory (DRAM) structures. In this regard, intensity distributions of diffraction orders in the collection pupil may be relatively uniform as described previously herein, which may provide relatively low tolerances for placement of photodetectors in the overlap regions. However, the systems and methods disclosed herein may also be suitable for samples having relatively thicker layers. In this case, the placement of the photodetectors may be accurately placed in symmetric regions of the positive and negative diffraction orders. Further, the systems and/or measurements may be calibrated to increase measurement accuracy.

It is further contemplated herein that the systems and methods disclosed herein may provide sensitive overlay metrology at a high throughput. For example, the non-imaging configuration enables the use of fast photodetectors suitable for fast scan speeds. As a non-limiting example, photodetectors having a bandwidth of 1 GHz may enable scan speeds of approximately 10 centimeters per second on Moiré targets having a pitch of 1 micrometer.

Additionally, the systems and methods disclosed herein may be relatively insensitive to target edge effects, which may enable the use of small target sizes and corresponding efficient use of space on the sample needed for overlay metrology measurements. For example, target edge effects may generally manifest as diffracted light in the pupil plane at angles associated with the target dimensions. However, the systems and methods disclosed herein limit collection of light to narrow ranges of static collection angles (e.g., associated with the sizes and locations of the photodetectors in the pupil plane) and capture time-varying data at these angles. Further, in some embodiments, an illumination beam may be extended along a direction of the grating structures (e.g., orthogonal to the direction of periodicity) to average out target noise associated with minor fluctuations in the features of the Moiré structures.

The Moiré structures may generally be formed as portions of overlay targets and may generally be located anywhere on the sample. In some embodiments, overlay metrology may be performed directly on device features having suitable geometries. By way of another example, overlay metrology may be performed on dedicated overlay targets, which may be located at any suitable locations such as, but not limited to, within dies or within scribe lines between dies. In this way, overlay measurements on overlay targets may be representative of the overlay of device features. Dedicated overlay targets may generally include features that are designed to provide accurate overlay measurements based on a particular overlay measurement technique. Further, overlay targets may include one or more measurement cells, where each cell includes printed elements in overlapping regions of one or more layers on the sample to form the Moiré structures. An overlay measurement may then be based on any combination of measurements of the various cells of the overlay target. For example, multiple cells of an overlay target may be designed with different intended offsets (e.g., grating structures in the various layers of the sample that are intentionally misaligned with known offset values), which may improve the accuracy and/or sensitivity of the measurement.

Additional embodiments of the present disclosure are directed to measuring overlay in at least two directions. In some embodiments, an overlay target includes two sets of cells, where a first set of cells includes Moiré structures oriented along a first diagonal direction different than but not orthogonal to a scan direction, and where a second set of cells includes Moiré structures oriented along a second diagonal direction orthogonal to the first diagonal direction. In this way, overlay measurements along the first and second diagonal directions may be generated during a scan. Further, the scan may be implemented by translating the sample through a measurement field and/or by translating one or more illumination beams.

In some embodiments, a sample is scanned by a translation stage along a stage-scan direction and one or more illumination beams are scanned along a beam-scan direction that may be orthogonal to the stage-scan direction. In this configuration, an overlay target may include two sets of cells, where a first set of cells includes Moiré structures with periodicity along the stage-scan direction, and where a second set of cells includes Moiré structures with periodicity along the beam-scan direction. Further, an illumination beam may travel along a diagonal path along each cell during a measurement.

Additional embodiments of the present disclosure are directed to simultaneously illuminating an overlay target with two or more spatially-separated illumination beams. For example, an overlay target may include two or more parallel rows of cells, where each row includes one or more cells distributed along a stage scan direction. In this way, the two or more illumination beams may simultaneously illuminate cells in the two or more rows for parallelized measurements as the sample is scanned along the stage-scan direction. Further, each of the spatially-separated illumination beams may be configured with different optical parameters such as, but not limited to, polarization or wavelength. Multiplexed optical parameters such as this may provide various benefits such as, but not limited to, generating metrology data with multiple optical configurations to improve the accuracy and/or sensitivity of the measurement, or providing a mechanism for efficient separation of measurement light from the sample associated with the different illuminated cells. It is noted that the use of simultaneous illumination of multiple cells may also be beneficial in the context of metrology systems designed for static targets.

It is contemplated herein that scatterometry overlay metrology of Moiré structures as disclosed herein may provide numerous benefits. For example, the capability to capture measurement signals indicative of overlay as a sample is scanned may avoid stage acceleration and deceleration times required to capture an image of a static target and may thus provide relatively high measurement throughput. In this way, the number of overlay measurements in a given time period may be substantially increased. By way of another example, the systems and method disclosed herein may enable the use of a relatively large portion of the pupil, which may allow for a high light budget and corresponding signal to noise ratio benefits. By way of another example, the systems and method disclosed herein may provide a straightforward extension of current scatterometry overlay metrology architectures and targets to scanning-mode metrology. For instance, systems designed for pupil plane imaging may be modified or supplemented to include photodetectors, as disclosed herein, to generate time-varying interference signals. By way of another example, as described previously, the relative insensitivity to target edge effects and spot shape control to provide noise averaging may enable the use of relatively smaller targets to promote both high-speed measurements and efficient use of space on the sample. It is noted that these considerations may also apply to metrology systems designed for static targets.

It is further contemplated herein that scatterometry overlay metrology of Moiré structures, as disclosed herein, may be implemented in combination with additional scanning scatterometry overlay metrology techniques. In some embodiments, the use of two pupil-plane photodetectors to generate time-varying interference signals may be combined with image-plane scatterometry overlay metrology techniques. For example, image-plane scatterometry overlay metrology is described generally in U.S. patent application Ser. No. 17/140,999 filed on Jan. 4, 2021, which is incorporated herein by reference in its entirety.

Referring now to FIGS. 1-9, systems and methods for scatterometry overlay metrology are described in greater detail in accordance with one or more embodiments of the present disclosure.

Figure 1B:
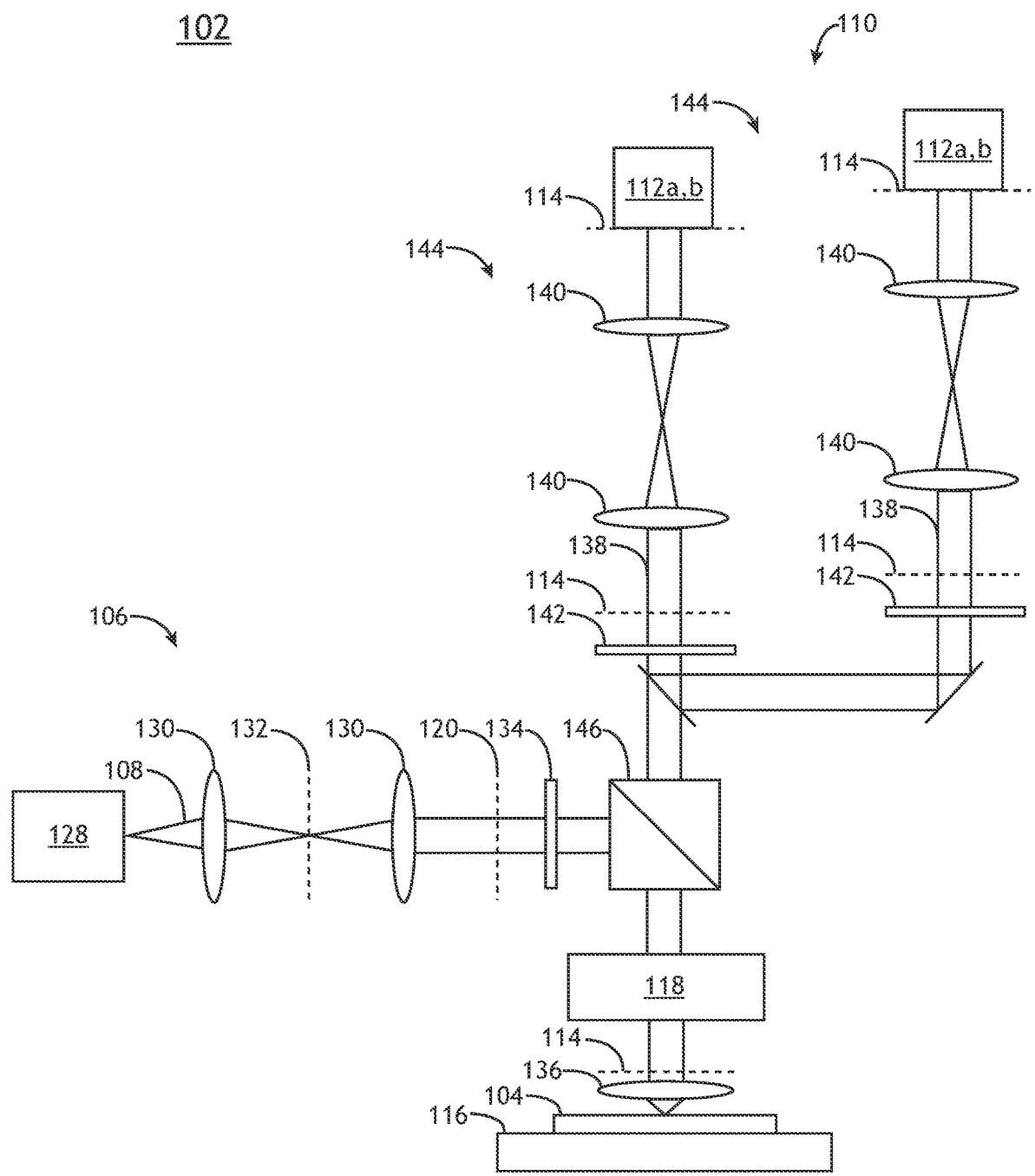
FIG. 1B is a schematic view of the overlay metrology tool, in accordance with one or more embodiments of the present disclosure.

FIG. 1A is a conceptual view of an overlay metrology system 100 for performing scatterometry overlay metrology on overlay targets with at least one Moiré structure, in accordance with one or more embodiments of the present disclosure. In some embodiments, the overlay metrology system 100 includes an overlay metrology tool 102 to perform scatterometry overlay measurements of a sample 104. For example, the overlay metrology tool 102 may perform scatterometry overlay measurements on portions of the sample 104 having Moiré structures such as, but not limited to, dedicated overlay targets. FIG. 1B is a schematic view of the overlay metrology tool 102, in accordance with one or more embodiments of the present disclosure.

In some embodiments, the overlay metrology tool 102 includes an illumination sub-system 106 to generate illumination in the form of one or more illumination beams 108 to illuminate the sample 104 and a collection sub-system 110 to collect light from the illuminated sample 104. For example, the one or more illumination beams 108 may be angularly limited on the sample 104 such that Moiré structures (e.g., in one or more cells of an overlay target) may generate discrete diffraction orders. Further, the one or more illumination beams 108 may be spatially limited such that they may illuminate selected portions of the sample 104. For instance, each of the one or more illumination beams 108 may be spatially limited to illuminate a particular cell of an overlay target. In some embodiments, the one or more illumination beams 108 underfill a particular cell of an overlay target.

The collection sub-system 110 may then collect at least some diffraction orders associated with diffraction of the illumination beam 108 from a Moiré structure. Further, the collection sub-system 110 may include at least two photodetectors 112 positioned in a collection pupil plane 114 at locations associated with time-varying interference signals indicative of overlay. For example, as will be described in greater detail below, suitable locations for the photodetectors 112 may include, but are not limited to, locations associated with positive and negative Moiré diffraction orders (e.g., combined diffraction orders, double diffraction orders, or the like), or locations associated with overlap between diffraction orders of the constituent gratings of a Moiré structure (e.g., an overlap region between +1 diffraction orders of top and bottom gratings and an overlap region between −1 diffraction orders of the top and bottom gratings).

In some embodiments, the overlay metrology tool 102 includes a translation stage 116 to scan the sample 104 through a measurement field of view of the overlay metrology tool 102 during a measurement to implement scanning metrology.

In some embodiments, the overlay metrology tool 102 includes a beam-scanning sub-system 118 configured to modify or otherwise control a position of at least one illumination beam 108 on the sample 104. For example, the beam-scanning sub-system 118 may scan an illumination beam 108 in a direction orthogonal to a scan direction (e.g., a direction in which the translation stage 116 scans the sample 104) during a measurement.

Referring now to FIGS. 2A-3B, the collection of diffraction orders from Moiré structures and the placement of the photodetectors 112 for scanning scatterometry overlay metrology is described in greater detail in accordance with one or more embodiments of the present disclosure.

Figure 2B:
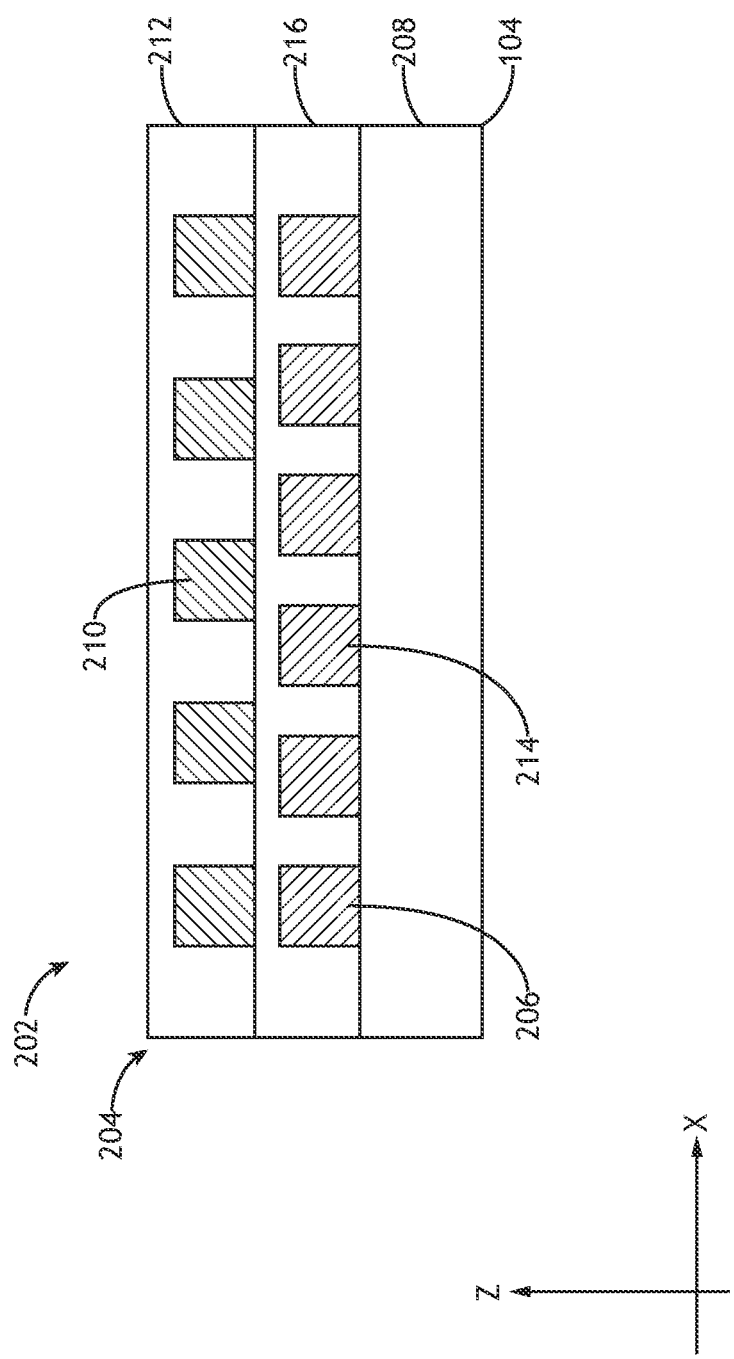
FIG. 2B is a side view of a single cell of the overlay target in FIG. 2A on a substrate, in accordance with one or more embodiments of the present disclosure.

FIG. 2A is a top view of a cell 202 of an overlay target 204 with a Moiré structure 206, in accordance with one or more embodiments of the present disclosure. FIG. 2B is a side view of a single cell 202 of the overlay target 204 in FIG. 2A on a substrate 208, in accordance with one or more embodiments of the present disclosure. In some embodiments, the Moiré structure 206 includes a first-layer grating 210 (e.g., a top grating) located on a first layer 212 of the sample 104 and a second-layer grating 214 (e.g., a bottom grating) located on a second layer 216 of the sample 104 oriented such that the regions including the first-layer grating 210 and the second-layer grating 214 overlap to form a grating-over-grating structure. Further, the first-layer grating 210 and the second-layer grating 214 have different pitches. For example, FIG. 2B illustrates the pitches of the first-layer grating 210 and the second-layer grating 214 as P and Q, respectively.

An overlay target 204 may generally be formed from any number of cells 202 and any particular cell 202 may include a Moiré structure 206 with a periodicity along any direction. Further, in some embodiments, an overlay target 204 includes multiple cells 202 with Moiré structures 206 having periodicity along a common direction, where the different cells 202 have different configurations of the periodicities of the associated gratings.

Figure 2C:
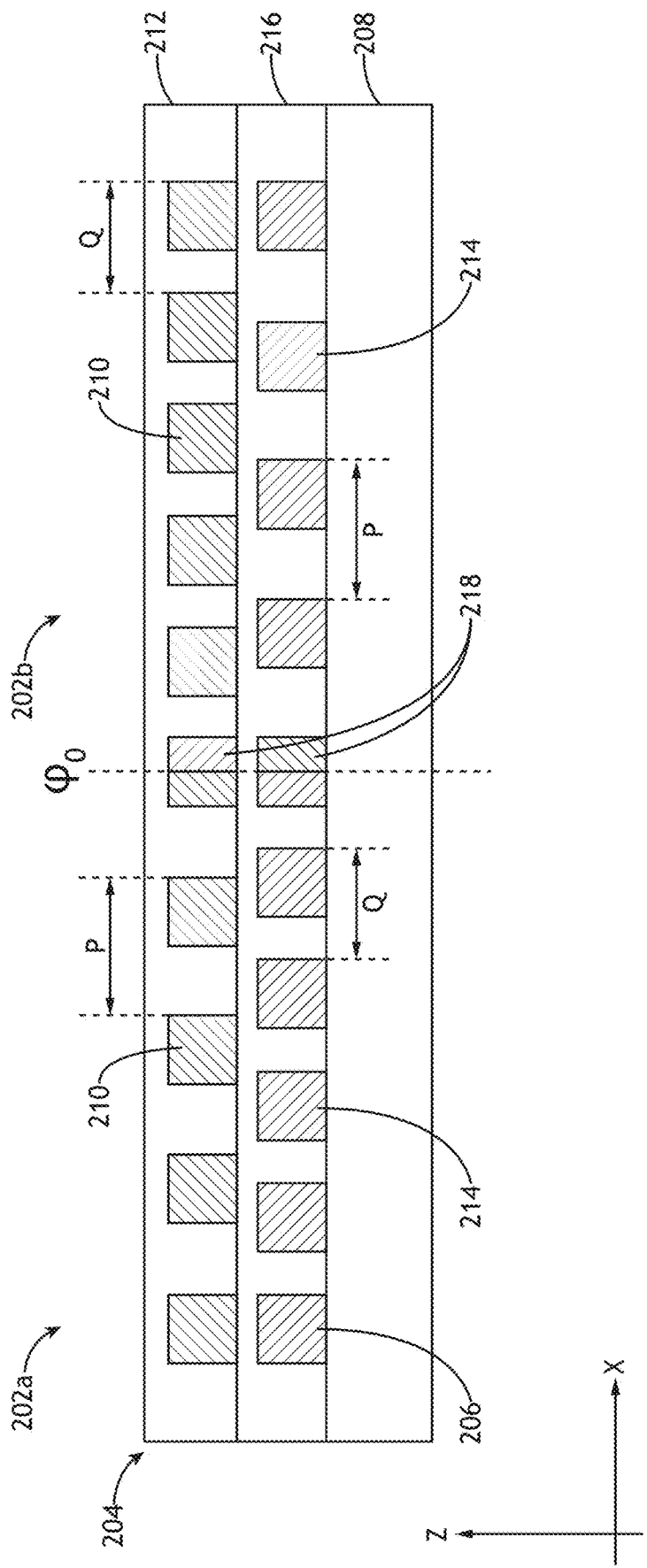
FIG. 2C is a side view of an overlay target including two cells with different configurations of Moiré structures suitable for an overlay measurement along a particular measurement direction, in accordance with one or more embodiments of the present disclosure.

FIG. 2C is a side view of an overlay target 204 including two cells 202a,b with different configurations of Moiré structures 206 suitable for an overlay measurement along a particular measurement direction (e.g., here, the X direction), in accordance with one or more embodiments of the present disclosure. In particular, FIG. 2C illustrates an inverted Moiré structure pair in which a first cell 202a includes a first-layer grating 210 with a first pitch (P) and a second-layer grating 214 with a second pitch (Q), whereas the second cell 202b includes a first-layer grating 210 with the second pitch (Q) and a second-layer grating 214 with the first pitch (P). It is contemplated herein that such an inverted Moiré structure pair may facilitate the determination of overlay based on time-varying interference signals generated as both cells 202 are scanned with respect to an illumination beam 108 during a measurement.

It is contemplated herein that the different cells 202a,b of an inverted Moiré structure pair may be oriented in various configurations in an overlay target 204. In some embodiments, the cells 202a,b are oriented side-by-side along a direction of periodicity (e.g., the X-direction in FIG. 2C).

Further, as illustrated in FIG. 2C, the cells 202 may be arranged to provide a continuous structure such that the phase transition associated with the time-varying interference signals is well-known and may be accounted for. Such an arrangement of an inverted Moiré structure pair may be, but is not required to be, referred to as a vertical overlay target. In particular, FIG. 2C represents a particular non-limiting configuration in which central target features 218 on the first layer 212 and the second layer 216 overlap. In this way, the center of the combined inverted Moiré structure pair may provide a reference point for the phase transition (e.g., $\varphi_0$) as will be described in greater detail below.

It is to be understood, however, that the overlay target 204 in FIGS. 2A-2C and the associated description are provided solely for illustrative purposes and should not be interpreted as limiting. Rather, the overlay target 204 may include any suitable Moiré overlay target design. For example, the overlay target 204 may include any number of cells 202 suitable for measurements along two directions. Further, the cells 202 may be distributed in any pattern or arrangement. For example, metrology target designs suitable for scanning metrology are generally described in U.S. Pat. No. 11,073,768 issued on Jul. 27, 2021, which is incorporated herein by reference in its entirety. In some embodiments, the overlay target 204 includes one or more cell groupings distributed along a scanning direction (e.g., a direction of motion of the sample 104), where cells 202 within each particular cell grouping are oriented to have Moiré structures periodic along a common direction. For instance, a first cell grouping may include one or more cells 202 having periodicities along the X direction and a second cell grouping may include one or more cells 202 having periodicities along the Y direction. In this way, all cells 202 within a particular cell grouping may be imaged at the same time while the sample 104 is scanned through a measurement field of view of the collection sub-system 110. By way of another example, diagonal targets suitable for metrology measurements in orthogonal directions in a single scan are described generally in U.S. Patent Publication No. 2021/0364935 published on Nov. 25, 2021, which is incorporated herein by reference in its entirety.

FIG. 2A further illustrates an illumination spot associated with an illumination beam 108 on the cell 202. In some embodiments, the illumination sub-system 106 underfills the cell 202 such that the size of the illumination beam 108 is smaller than the cell 202. As a result, a distribution of light in the collection pupil plane 114 may be substantially limited to light diffracted from the grating-over-grating features in the cell 202 and target edge effects may be minimized or substantially eliminated. Further, the illumination beam 108 may be sized based on the size and/or pitch of a Moiré structure in a cell 202. In a general sense, the illumination beam 108 may generally be sized to be less than a height of the cell 202 and to have a width at least one pitch smaller than the width of the cell 202 to provide clear interference fringes.

As an example, FIG. 2A illustrates an illumination beam 108 having a width along the measurement direction (here the X direction) set to approximately half of the pitch of the gratings in the Moiré structure 206. In one non-limiting instance, the dimensions of the illumination beam 108 suitable for a 10 micrometer square cell 202 may be 1.5 micrometers in the Y direction and 0.5 micrometers in the X direction, which may be achieved with an oval pupil in the illumination pupil plane 120 of 0.9×0.3 NA. However, it is to be understood that the depiction of the illumination beam 108 in FIG. 2A is provided solely for illustrative purposes and should not be interpreted as limiting. The illumination beam 108 may generally have any size suitable for generating overlapping 0 and first-order diffraction as described herein.

In some embodiments, the illumination beam 108 may be elongated in a direction perpendicular to a measurement direction to further mitigate target-induced noise caused by imperfections in the cell 202 such as, but not limited to, roughness of the first-layer grating 210 or the second-layer grating 214. For example, FIG. 2A illustrates the illumination beam 108 elongated along the Y direction.

Figure 3A:
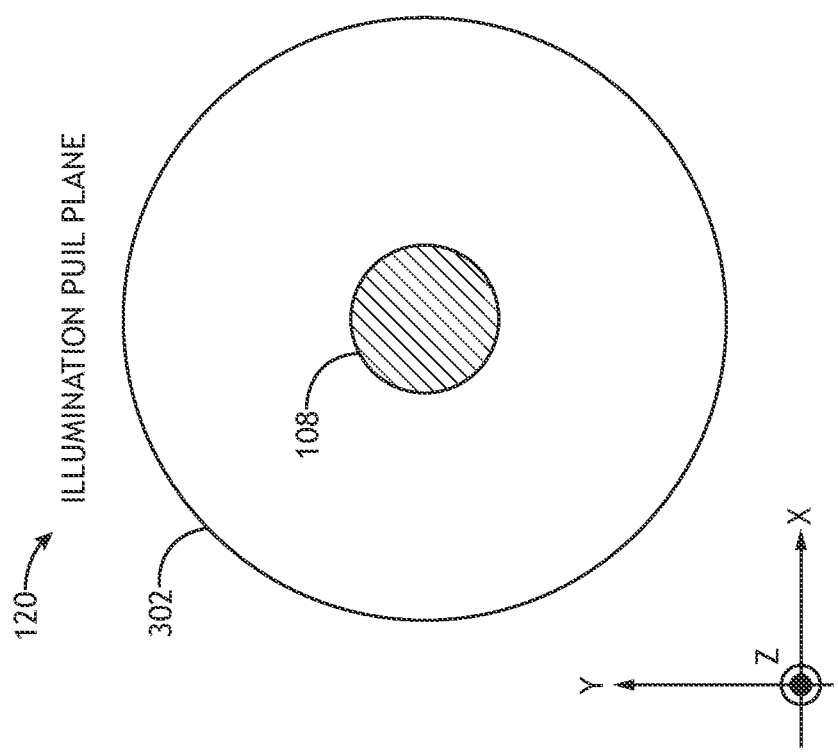
FIG. 3A is a top view of an illumination pupil in an illumination pupil plane of the overlay metrology tool, in accordance with one or more embodiments of the present disclosure.
Figure 3B:
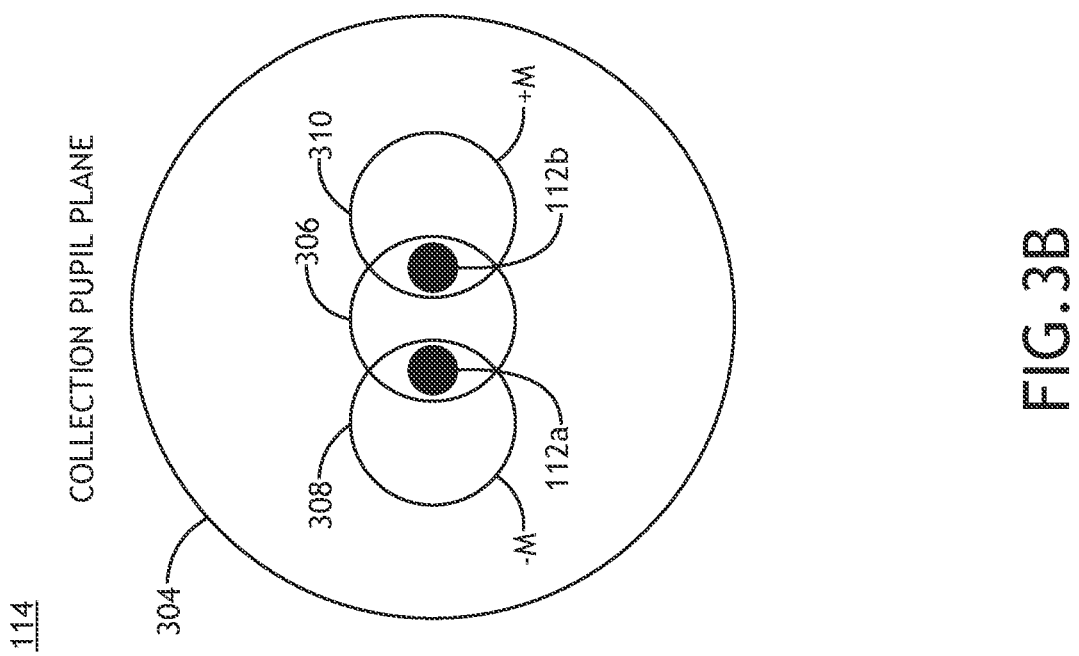
FIG. 3B is a top view of a collection pupil in the collection pupil plane of the overlay metrology tool including Moiré diffraction lobes associated with the illumination profile in FIG. 3A by a Moiré structure, in accordance with one or more embodiments of the present disclosure.
Figures 3C, 3D:
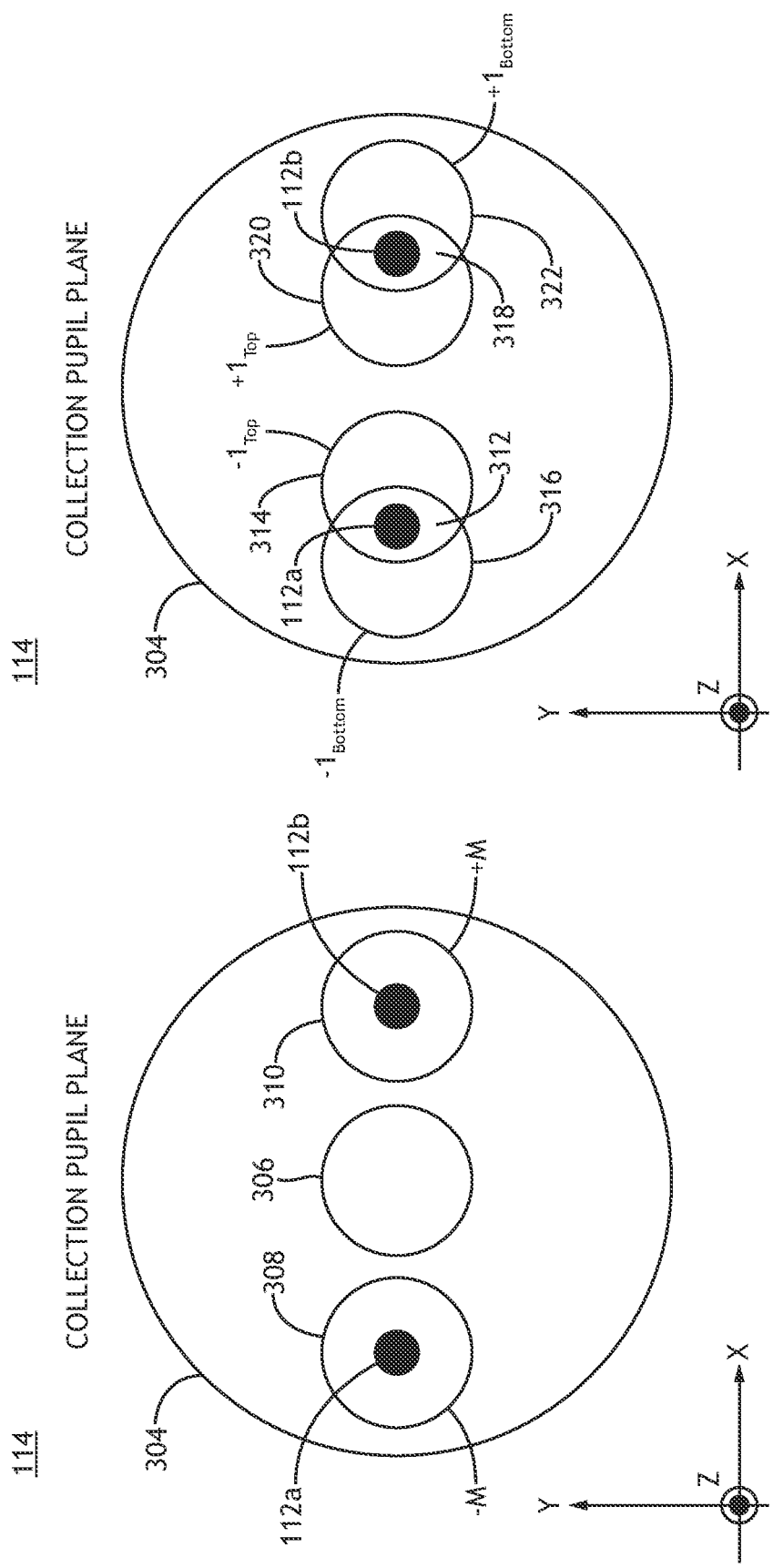
FIG. 3C is a top view of a collection pupil of the overlay metrology tool including isolated first-order Moiré diffraction of the illumination profile in FIG. 3A by a Moiré structure, in accordance with one or more embodiments of the present disclosure.
FIG. 3D is a top view of a collection pupil in the collection pupil plane of the overlay metrology tool including overlapping first-order diffraction of the illumination profile in FIG. 3A by a Moiré structure, in accordance with one or more embodiments of the present disclosure.

Referring now to FIGS. 3A-3C, various non-limiting configurations for the generation and measurement of time-varying interference signals from a Moiré structure 206 in a cell 202 of an overlay target 204 are described in accordance with one or more embodiments of the present disclosure.

FIG. 3A is a top view of an illumination pupil 302 in an illumination pupil plane 120 of the overlay metrology tool 102, in accordance with one or more embodiments of the present disclosure. For example, the illumination pupil plane 120 may correspond to a pupil plane in the illumination sub-system 106 as illustrated in FIG. 1B. In some embodiments, the illumination sub-system 106 illuminates the overlay target 204 with one or more illumination beams 108 at normal incidence (or near-normal incidence) as illustrated in FIG. 3A. Further, the one or more illumination beams 108 may illuminate the overlay target 204 with a limited range of incidence angles as illustrated by the limited size in the collection pupil plane 114. In this regard, the overlay target 204 may diffract the one or more illumination beams 108 into discrete diffraction orders.

FIGS. 3B-3D illustrate various non-limiting configurations for capturing time-varying interference signals from an overlay target 204 with a Moiré structure 206 in a scanning configuration. In particular, FIGS. 3B-3D illustrate various non-limiting configurations of diffraction orders of the illumination beam 108 illustrated in FIG. 3A in a collection pupil plane 114 and associated positions of photodetectors 112 suitable for capturing time-varying interference signals from which an overlay measurement may be extracted. It is contemplated herein that photodetectors 112 placed at locations in the collection pupil plane 114 associated with Moiré diffraction lobes (e.g., combined diffraction lobes, double diffraction lobes, or the like) and/or overlapping diffraction lobes (e.g., areas at which first-order diffraction lobes from a first-layer grating 210 and a second-layer grating 214 of a Moiré structure 206) may capture time-varying interference signals indicative of overlay. It is further contemplated herein that time-varying interference signals associated with combined diffraction lobes may be captured by a photodetector 112 when each of the relevant diffraction lobes are incident on the photodetector 112 (e.g., are within a measurement area of the photodetector 112). In this way, the relevant diffraction lobes need not necessarily overlap in the collection pupil plane 114 but rather may overlap on the photodetector 112.

It is recognized herein that the distribution of diffracted orders of an illumination beam 108 by a periodic structure such as a Moiré structure 206 may be influenced by a variety of parameters such as, but not limited to, a wavelength of the illumination beam 108, an incidence angle of the illumination beam 108 in both altitude and azimuth directions, pitches of the gratings of the Moiré structure 206, or a numerical aperture (NA) of a collection lens. Accordingly, in embodiments of the present disclosure, the illumination sub-system 106, the collection sub-system 110, and the overlay target 204 may be configured (e.g., according to a metrology recipe defining a selected set of associated parameters) to provide a desired distribution of diffraction orders in a collection pupil plane 114 suitable for generating time-varying interference patterns indicative of overlay. For example, the illumination sub-system 106 and/or the collection sub-system 110 may be configured to generate measurements on Moiré structures having selected range periodicities to provide a desired distribution in the collection pupil plane 114. Further, various components of the illumination sub-system 106 and/or the collection sub-system 110 (e.g., stops, pupils, or the like) may be adjustable to provide the desired distribution in the collection pupil plane 114.

Further, the sizes and shapes of diffraction orders in the collection pupil plane 114 may generally be related to the size and shape of an illumination beam 108 on the sample 104. For example, although not shown, in the case that the illumination beam 108 is elongated (e.g., as illustrated in FIG. 2A), the associated diffraction orders may similarly be elongated (e.g., in orthogonal directions).

FIG. 3B is a top view of a collection pupil 304 in the collection pupil plane 114 of the overlay metrology tool 102 including Moiré diffraction lobes associated with the illumination profile in FIG. 3A by a Moiré structure 206, in accordance with one or more embodiments of the present disclosure. For example, the collection pupil plane 114 may correspond to a pupil plane in the collection sub-system 110 as illustrated in FIG. 1B. In particular, FIG. 3B illustrates 0-order diffraction 306, −1 order Moiré diffraction 308 (e.g., −M diffraction), and +1 order Moiré diffraction 310 (e.g., +M diffraction) distributed along the direction of periodicity of the Moiré structure 206 (e.g., the X direction here) in the collection pupil plane 114. For example, the −1 order Moiré diffraction 308 and the +1 order Moiré diffraction 310 may be associated with Moiré diffraction from first-layer grating 210 and the second-layer grating 214 (e.g., a double diffraction order), where the diffraction angles are based on a pitch of Moiré interference associated with the pitch differences between the first-layer grating 210 and the second-layer grating 214.

It is contemplated herein that the phase of each of the Moiré diffraction orders (e.g., the −1 order Moiré diffraction 308 and the +1 order Moiré diffraction 310) may oscillate during a scan to form time-varying interference signals and overlay may be determined based on asymmetries of these oscillations. As a result, an overlay measurement may be performed by capturing and comparing these time-varying interference patterns.

In some embodiments, the overlay metrology tool 102 includes photodetectors 112 located at positions suitable for capturing overlapping 0-order diffraction and Moiré diffraction. For example, FIG. 3B illustrates a configuration in which the Moiré diffraction lobes overlap with 0-order diffraction in the collection pupil plane 114 (e.g., as provided by a metrology recipe). FIG. 3B further illustrates a first photodetector 112a located at a region of overlap between the −1 order Moiré diffraction 308 and a second photodetector 112b located at a region of overlap between the +1 order Moiré diffraction 310. Each of the photodetectors 112 may then capture a time-varying interference signal as the sample 104 is scanned, where differences between the time-varying interference signals captured by the photodetectors 112 are indicative of overlay.

It is contemplated herein that the differences in pitch between the top and bottom gratings of Moiré structure 206 (e.g., the first-layer grating 210 and the second-layer grating 214) result in a shift of the phase of the Moiré diffraction orders (e.g., the −1 order Moiré diffraction 308 and the +1 order Moiré diffraction 310). In particular, as an overlay target 204 is scanned along a direction of periodicity of a Moiré structure 206 (e.g., the X direction in FIGS. 2A and 2B) the phase of the Moiré diffraction orders (shifts in opposite directions. However, by capturing this phase shift across the length of the Moiré structure 206 along the measurement direction during a scan, the actual physical overlay associated with the first layer 212 and the second layer 216 may be determined. In this way, the data collected during the scanning measurement may be functionally equivalent or comparable to a static measurement with an image-based system, but may retain the benefits of scanning overlay such as increased throughput.

For example, the time-varying signals associated with cells 202a,b of an overlay target 204 forming an inverted Moiré structure pair as depicted in FIG. 2C may be written as:

$$I_{c1\pm} = (E_0 + E_1)^2 = \tag{1}$$
$$(E_0)^2 + (E_1)^2 + E_0 E_1 = DC + 2A_1 A_0 \cos\left[\frac{2\pi}{P_m}(X - X_0 - OVL) \pm \varphi\right]$$

$$I_{c2\pm} = (E_0 + E_1)^2 = \tag{2}$$
$$(E_0)^2 + (E_1)^2 + E_0 E_1 = DC + 2A_1' A_0' \cos\left[\frac{2\pi}{P_m}(X - X_0 + 0VL) \pm \theta\right]$$

where c1 and c2 represent cells 202a,b, a subscript of 0 represents 0-order diffraction 306, a subscript of 1 represents first-order Moiré diffraction (e.g., −1 order Moiré diffraction 308 or +1 order Moiré diffraction 310), DC represents a non-oscillating term, $P_m$ represents an effective Moiré pitch associated with the Moiré diffraction orders, OVL represents overlay between the first layer 212 and the second layer 216, $X_0$ relates to an initial scanning position of the illumination beam 108 with respect to the overlay target 204, and φ and θ are phase terms.

From Equations (1) and (2), phases may be calculated as:

$$Ph_{P1\pm} = \phi_{1,\pm1} = -\frac{2\pi}{P_m}X_0 - \frac{2\pi}{P_m}OVL \pm \varphi \tag{3}$$

$$Ph_{P2\pm} = \phi_{2,\pm1} = -\frac{2\pi}{P_m}X_0 - \frac{2\pi}{P_m}OVL \pm \theta. \tag{4}$$

Taking Equations (1)-(4) together, the overlay may be solved as:

$$OVL = \frac{P_m}{8\pi}(\phi_{1,1} + \phi_{1,-1} - \phi_{2,1} - \phi_{2,-1}) \tag{5}$$

It is to be understood, however, that the particular configuration illustrated in FIG. 3B and the associated description is not limiting. For example, as described previously herein, the 0-order diffraction 306 need not necessarily overlap with the −1 order Moiré diffraction 308 and the +1 order Moiré diffraction 310 in the collection pupil 304 as illustrated in FIG. 3B. Rather, in some embodiments, these diffraction lobes are sufficiently close together that the 0-order diffraction 306 overlaps with the −1 order Moiré diffraction 308 on a first photodetector 112a and the 0-order diffraction 306 overlaps with the +1 order Moiré diffraction 310 on a second photodetector 112b. Additionally, in some embodiments, an overlay measurement is determined based on time-varying signals associated with only the first-order Moiré diffraction lobes (e.g., without reference to 0-order diffraction 306. FIG. 3C is a top view of a collection pupil 304 of the overlay metrology tool 102 including isolated first-order Moiré diffraction of the illumination profile in FIG. 3A by a Moiré structure 206, in accordance with one or more embodiments of the present disclosure.

Referring now to FIG. 3D, the determination of overlay based on time-varying interference signals associated with overlapping first-order diffraction from gratings on the first layer 212 and second layer 216, in accordance with one or more embodiments of the present disclosure.

FIG. 3D is a top view of a collection pupil 304 in the collection pupil plane 114 of the overlay metrology tool 102 including overlapping first-order diffraction of the illumination profile in FIG. 3A by a Moiré structure 206, in accordance with one or more embodiments of the present disclosure. In FIG. 3D, various diffraction orders that may be present such as, but not limited to, 0-order diffraction 306, −1 order Moiré diffraction 308, and +1 order Moiré diffraction 310 are omitted for clarity of illustration.

In some embodiments, the illumination sub-system 106, the collection sub-system 110, and the overlay target 204 are configured to provide that the first-order diffraction from the first-layer grating 210 and the second-layer grating 214 overlap in the collection pupil 304. In FIG. 3D, a first photodetector 112a is located in a first overlap region 312 between −1 order diffraction 314 from the first-layer grating 210 ($-1_{TOP}$) and −1 order diffraction 316 from the second-layer grating 214 ($-1_{BOTTOM}$), and a second photodetector 112b is located in a second overlap region 318 between +1 order diffraction 320 from the first-layer grating 210 ($+1_{TOP}$) and +1 order diffraction 322 from the second-layer grating 214 ($+1_{BOTTOM}$). Further, the first-order diffraction lobes 314, 316, 320, 322 need not necessarily overlap in the collection pupil plane 114, but may overlap on the respective photodetectors 112a,b in some embodiments.

It is contemplated herein that the intensity and phase within each of the overlap regions in FIG. 3D (e.g., the first overlap region 312 and the second overlap region 318) may oscillate to form time-varying interference patterns in a manner similar to FIG. 3B, which are also indicative of overlay between the first layer 212 and the second layer 216. In this way, a measurement of the overlay between the physical overlay (or overlay error) between the first layer 212 and the second layer 216 may similarly be generated based on a comparison of the time-varying interference patterns captured by the photodetectors 112 in FIG. 3D.

For example, the time-varying signals associated with cells 202a,b of an overlay target 204 forming an inverted Moiré structure pair as depicted in FIG. 2C may be written as:

$$K_{c1}(x)_{\pm1} = A_p A_q \cos 2\pi\left[\frac{1}{P_m}x - \frac{X_0}{Q} + \frac{X_0 + OVL}{P} \pm \frac{\Delta\Psi_1}{2\pi}\right] \tag{6}$$

$$K_{c2}(x)_{\pm1} = A_p' A_q' \cos 2\pi\left[\frac{1}{P_m}x - \frac{X_0}{P} + \frac{X_0 - OVL}{Q} \pm \frac{\Delta\Psi_2}{2\pi}\right] \tag{7}$$

where c1 and c2 represent cells 202a,b, P and Q are first and second pitches of the inverted Moiré structure pair illustrated in FIG. 2C, the subscripts p and q relate to signal strengths associated with pitches P and Q, $P_m$ represents an effective Moiré pitch associated with the Moiré diffraction orders, OVL represents overlay between the first layer 212 and the second layer 216, and $\Psi_1$ and $\Psi_2$ are phase terms.

From Equations (6) and (7), the phase information for the negative diffraction orders may be written as:

$$\phi_1 = 2\pi\left(-\frac{X_0}{Q} + \frac{X_0 + OVL}{P} - \frac{\Delta\Psi_1}{2\pi}\right) \quad (8)$$

$$\phi_2 = 2\pi\left(-\frac{X_0}{P} + \frac{X_0 + OVL}{Q} - \frac{\Delta\Psi_2}{2\pi}\right) \quad (9)$$

while the phase information for the positive diffraction orders may be written as:

$$\phi_3 = 2\pi\left(-\frac{X_0}{Q} + \frac{X_0 + OVL}{P} + \frac{\Delta\Psi_1}{2\pi}\right) \quad (10)$$

$$\phi_4 = 2\pi\left(-\frac{X_0}{P} + \frac{X_0 + OVL}{Q} + \frac{\Delta\Psi_2}{2\pi}\right) \quad (11)$$

The overlay (OVL) may then be determined based on equations (8)-(11) as follows:

$$\phi_1 - \phi_2 = 2\pi\left(\left(\frac{1}{P} + \frac{1}{Q}\right)OVL - \frac{\Delta\Psi_1}{2\pi} + \frac{\Delta\Psi_2}{2\pi}\right) \quad (12)$$

$$\phi_3 - \phi_4 = 2\pi\left(\left(\frac{1}{P} + \frac{1}{Q}\right)OVL + \frac{\Delta\Psi_1}{2\pi} - \frac{\Delta\Psi_2}{2\pi}\right) \quad (13)$$

$$2\pi\frac{P+Q}{PQ}OVL = \frac{\phi_1 - \phi_2 + \phi_3 - \phi_4}{2} \quad (14)$$

$$OVL = \frac{\phi_1 - \phi_2 + \phi_3 - \phi_4}{4\pi} \cdot \frac{PQ}{P+Q} \quad (15)$$

Referring now generally to FIGS. 3A-3D, it is to be understood that FIGS. 3A-3D are provided solely for illustrative purposes and should not be interpreted as limiting. For example, FIGS. 3A-3D illustrate a non-limiting case of diffraction of an illumination beam 108 incident on the sample at normal incidence. However, it is contemplated herein that the illumination beam 108 may generally have any profile suitable for allowing collection of combined or overlapping diffraction orders as disclosed herein (e.g., Moiré diffraction orders associated with combined diffraction from overlapping gratings of a Moiré structure 206, overlapping Moiré diffraction and 0-order diffraction, overlapping first-order diffraction from the constituent gratings of a Moiré structure 206, or the like). In some embodiments, the illumination beam 108 has an annular profile. It is contemplated herein that an annular profile of an illumination beam 108 may facilitate separation of overlapping diffraction orders in the collection pupil plane 114. The use of annular apertures to separate overlapping diffraction orders is generally described in U.S. Pat. No. 10,197,389 issued on Feb. 9, 2019, which is incorporated herein by reference in its entirety. It is noted that although U.S. Pat. No. 10,197,389 includes descriptions of static metrology, the use of an annular illumination beam 108 may be similarly utilized in scanning metrology as disclosed herein. In particular, in some embodiments, photodetectors 112 are placed at locations of overlapping diffraction orders (e.g., overlapping Moiré diffraction and 0-order diffraction, overlapping first-order diffraction from the constituent gratings of a Moiré structure 206, or the like) generated based on an annular illumination beam 108.

Referring again to FIG. 1A, additional components of the overlay metrology tool 102 are described in greater detail in accordance with one or more embodiments of the present disclosure.

The photodetectors 112 may generally include any type of optical detector known in the art suitable for capturing interference signals generated as the sample 104 is translated by the translation stage 116 and/or as one or more illumination beams 108 are scanned by the beam-scanning subsystem 118. For example, the photodetectors 112 may include, but are not limited to, fast photodiodes, photomultipliers, or avalanche photodiodes.

In a general sense, the bandwidth or response time of the photodetectors 112 should be sufficient to resolve the temporal frequency of the interference fringes, which is related to the pitch of the top and bottom gratings of a Moiré structure 206 and the scanning speed along a measurement direction (the direction of periodicity of the Moiré structure 206). For example, in the case of a scan speed along a measurement direction of 10 centimeters per second and a target pitch of 1 micrometer, the interference signals will oscillate at a rate on the order of 100 kHz. In some embodiments, the photodetectors 112 include photodetectors having a bandwidth of at least 1 GHz. However, it is to be understood that this value is not a requirement. Rather, the bandwidth of the photodetectors 112, the translation speed along the measurement direction, and the pitch of the Moiré structures may be selected together to provide a desired sampling rate of the interference signal.

In some embodiments, the overlay metrology system 100 includes a controller 122 communicatively coupled to the overlay metrology tool 102. The controller 122 may include one or more processors 124 and a memory device 126, or memory. For example, the one or more processors 124 may be configured to execute a set of program instructions maintained in the memory device 126.

The one or more processors 124 of the controller 122 may generally include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 124 may include any device configured to execute algorithms and/or instructions (e.g., program instructions stored in memory). In some embodiments, the one or more processors 124 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 122 may include one or more controllers housed in a common housing or within multiple housings. In this way, any controller or combination of controllers may be separately packaged as a module suitable for integration into metrology overlay metrology system 100. Further, the controller 122 may analyze or otherwise process data received from the photodetectors 112 and feed the data to additional components within the overlay metrology system 100 or external to the overlay metrology system 100.

Further, the memory device 126 may include any storage medium known in the art suitable for storing program instructions executable by the associated one or more processors 124. For example, the memory device 126 may include a non-transitory memory medium. As an additional example, the memory device 126 may include, but is not limited to, a read-only memory, a random-access memory, a magnetic or optical memory device (e.g., disk), a magnetic tape, a solid-state drive and the like. It is further noted that memory device 126 may be housed in a common controller housing with the one or more processors 124.

In this regard, the controller 122 may execute any of various processing steps associated with overlay metrology. For example, the controller 122 may be configured to generate control signals to direct or otherwise control the overlay metrology tool 102, or any components thereof. For instance, the controller 122 may be configured to direct the translation stage 116 to translate the sample 104 along one or more measurement paths, or swaths, to scan one or more overlay targets through a measurement field of view of the overlay metrology tool 102 and/or direct the beam-scanning sub-system 118 to position or scan one or more illumination beams 108 on the sample 104. By way of another example, the controller 122 may be configured to receive signals corresponding to the time-varying interference signals from the photodetectors 112. By way of another example, the controller 122 may generate correctables for one or more additional fabrication tools as feedback and/or feed-forward control of the one or more additional fabrication tools based on overlay measurements from the overlay metrology tool 102.

In another embodiment, the controller 122 captures the interference signals detected by the photodetectors 112. The controller 122 may generally capture data such as, but not limited to, the magnitudes or the phases of the time-varying interference signals using any technique known in the art such as, but not limited to, one or more phase-locked loops. Further, the controller 122 may capture the interference signals, or any data associated with the interference signals, using any combination of hardware (e.g., circuitry) or software techniques.

In some embodiments, the controller 122 determines an overlay measurement between layers of the overlay target 204 (e.g., the first layer 212 and the second layer 216) along the measurement direction based on the comparison of the interference signals. For example, the controller 122 may determine an overlay measurement based on the magnitudes and/or phases of the interference signals in a manner such as, but not limited to, described in Equations (1)-(15). For instance, U.S. Pat. No. 10,824,079 referenced above and incorporated herein by reference in its entirety generally describes the electric field of diffracted orders in a collection pupil and further provides specific relationships between overlay and measured intensity in the pupil plane. It is contemplated herein that the systems and methods disclosed herein may extend the teachings of U.S. Pat. No. 10,824,079 to time-varying interference signals captured by photodetectors placed in overlap regions between 0 and +/−1 diffraction orders). In particular, it is contemplated herein that overlay on a sample may be proportional to asymmetries such as, but not limited to, a relative phase shift between the two time-varying interference signals.

Further, the controller 122 may calibrate or otherwise modify the overlay measurement based on known, assumed, or measured features of the sample that may also impact the time-varying interference signals such as, but not limited to, sidewall angles or other sample asymmetries.

Referring again to FIG. 1B, various components of the overlay metrology tool 102 are described in greater detail in accordance with one or more embodiments of the present disclosure.

In some embodiments, the illumination sub-system 106 includes an illumination source 128 configured to generate at least one illumination beam 108. The illumination from the illumination source 128 may include one or more selected wavelengths of light including, but not limited to, ultraviolet (UV) radiation, visible radiation, or infrared (IR) radiation.

The illumination source 128 may include any type of illumination source suitable for providing at least one illumination beam 108. In some embodiments, the illumination source 128 is a laser source. For example, the illumination source 128 may include, but is not limited to, one or more narrowband laser sources, a broadband laser source, a supercontinuum laser source, a white light laser source, or the like. In this regard, the illumination source 128 may provide an illumination beam 108 having high coherence (e.g., high spatial coherence and/or temporal coherence). In some embodiments, the illumination source 128 includes a laser-sustained plasma (LSP) source. For example, the illumination source 128 may include, but is not limited to, an LSP lamp, an LSP bulb, or an LSP chamber suitable for containing one or more elements that, when excited by a laser source into a plasma state, may emit broadband illumination.

In some embodiments, the illumination sub-system 106 includes one or more optical components suitable for modifying and/or conditioning the illumination beam 108 as well as directing the illumination beam 108 to the sample 104. For example, the illumination sub-system 106 may include one or more illumination lenses 130 (e.g., to collimate the illumination beam 108, to relay an illumination pupil plane 120 and/or an illumination field plane 132, or the like). In some embodiments, the illumination sub-system 106 includes one or more illumination control optics 134 to shape or otherwise control the illumination beam 108. For example, the illumination control optics 134 may include, but are not limited to, one or more field stops, one or more pupil stops, one or more polarizers, one or more filters, one or more beam splitters, one or more diffusers, one or more homogenizers, one or more apodizers, or one or more beam shapers, or one or more mirrors (e.g., static mirrors, translatable mirrors, scanning mirrors, or the like).

In some embodiments, the overlay metrology tool 102 includes an objective lens 136 to focus the illumination beam 108 onto the sample 104 (e.g., an overlay target with overlay target elements located on two or more layers of the sample 104).

In some embodiments, the illumination sub-system 106 illuminates the sample 104 with two or more illumination beams 108. Further, the two or more illumination beams 108 may be, but are not required to be, incident on different portions of the sample 104 (e.g., different cells of an overlay target) within a measurement field of view (e.g., a field of view of the objective lens 136). It is contemplated herein that the two or more illumination beams 108 may be generated using a variety of techniques. In some embodiments, the illumination sub-system 106 includes two or more apertures at an illumination field plane 132. In some embodiments, the illumination sub-system 106 includes one or more beamsplitters to split illumination from the illumination source 128 into the two or more illumination beams 108. In some embodiments, at least one illumination source 128 generates two or more illumination beams 108 directly. In a general sense, each illumination beam 108 may be considered to be a part of a different illumination channel regardless of the technique in which the various illumination beams 108 are generated.

In some embodiments, the collection sub-system 110 includes at least two photodetectors 112 (e.g., photodetectors 112a,b) located at a collection pupil plane 114 configured to capture light from the sample 104 (e.g., collected light 138), where the collected light 138 includes at least the 0-order diffraction 306, the −1 order Moiré diffraction 308, and the +1 order Moiré diffraction 310 as illustrated in FIG. 3B. The collection sub-system 110 may include one or more optical elements suitable for modifying and/or conditioning the collected light 138 from the sample 104. In some embodiments, the collection sub-system 110 includes one or more collection lenses 140 (e.g., to collimate the illumination beam 108, to relay pupil and/or field planes, or the like), which may include, but are not required to include, the objective lens 136. In some embodiments, the collection sub-system 110 includes one or more collection control optics 142 to shape or otherwise control the collected light 138. For example, the collection control optics 142 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the collection sub-system 110 includes two or more collection channels 144, each with a separate pair of photodetectors 112. For example, as illustrated in FIG. 1B, the overlay metrology tool 102 may include one or more beamsplitters 146 arranged to split the collected light 138 into the collection channels 144. Further, the beamsplitters 146 may be polarizing beamsplitters, non-polarizing beamsplitters, or a combination thereof. It is to be understood, however, that the illustration of two collection channels 144 in FIG. 1B is provided solely for illustrative purposes and should not be interpreted as limiting. For example, the collection sub-system 110 may include a single collection channel 144 or multiple collection channels 144.

In some embodiments, multiple collection channels 144 are configured to collect light from multiple illumination beams 108 on the sample 104. For example, in the case that an overlay target 204 has two or more cells 202 distributed in a direction different than a scan direction, the overlay metrology tool 102 may simultaneously illuminate the different cells 202 with different illumination beams 108 and simultaneously capture interference signals associated with each illumination beam 108. Additionally, in some embodiments, multiple illumination beams 108 directed to the sample 104 may have different polarizations. In this way, the diffraction orders associated with each of the illumination beams 108 may be separated. For example, polarizing beamsplitters 146 may efficiently separate the diffraction orders associated with the different illumination beams 108. By way of another example, polarizers may be used in one or more collection channels 144 to isolate desired diffraction orders for measurement.

In some embodiments, the overlay metrology tool 102 includes a beam-scanning sub-system 118 to position, scan, or modulate positions of one or more illumination beams 108 on the sample 104 during measurement.

The beam-scanning sub-system 118 may include any type or combination of elements suitable for scanning positions of one or more illumination beams 108. In some embodiments, the beam-scanning sub-system 118 includes one or more deflectors suitable for modifying a direction of an illumination beam 108. For example, a deflector may include, but is not limited to, a rotatable mirror (e.g., a mirror with adjustable tip and/or tilt). Further, the rotatable mirror may be actuated using any technique known in the art. For example, the deflector may include, but is not limited to, a galvanometer, a piezo-electric mirror, or a micro-electromechanical system (MEMS) device. By way of another example, the beam-scanning sub-system 118 may include an electro-optic modulator, an acousto-optic modulator, or the like.

The deflectors may further be positioned at any suitable location in the overlay metrology tool 102. In some embodiments, one or more deflectors are placed at one or more pupil planes common to both the illumination sub-system 106 and the collection sub-system 110. In this regard, the beam-scanning sub-system 118 may be a pupil-plane beam scanner and the associated deflectors may modify the positions of one or more illumination beams 108 on the sample 104 without impacting positions of diffraction orders in the collection pupil plane 114. Further, a distribution of one or more illumination beams 108 in an illumination field plane 132 may further be stable as the beam-scanning sub-system 118 modifies positions of the one or more illumination beams 108 on the sample 104. Pupil-plane beam scanning is described generally in U.S. patent application Ser. No. 17/142,783 filed on Jan. 6, 2021, which is incorporated by reference in its entirety.

Referring now to FIGS. 4-8B, various exemplary configurations of the overlay target 204 and corresponding configurations of the overlay metrology tool 102 are described in greater detail in accordance with one or more embodiments of the present disclosure. In FIGS. 4-8B, only the first-layer grating 210 is shown for clarity. However, it is to be understood that the overlay targets 204 include Moiré structures 206 as described previously herein. Additionally, overlay data associated with the first layer 212 and the second layer 216 of a sample 104 may be based on measurements of any number of cells 202 with Moiré structures 206 based on any overlay technique known in the art. For example, an overlay target 204 may include different cells 202 with Moiré structures 206 having different intended offsets. By way of another example, an overlay target 204 may include different cells 202 with different configurations of Moiré structures 206. In one instance, an overlay target 204 includes at least one pair of cells 202 having Moiré structures 206 with inverted pitches to form an inverted Moiré structure pair (e.g., as illustrated in FIG. 2C). In a general sense, the systems and methods disclosed herein may be utilized to implement any overlay technique associated with any arrangement of an overlay target 204 with at least one Moiré structure 206.

Figure 4:
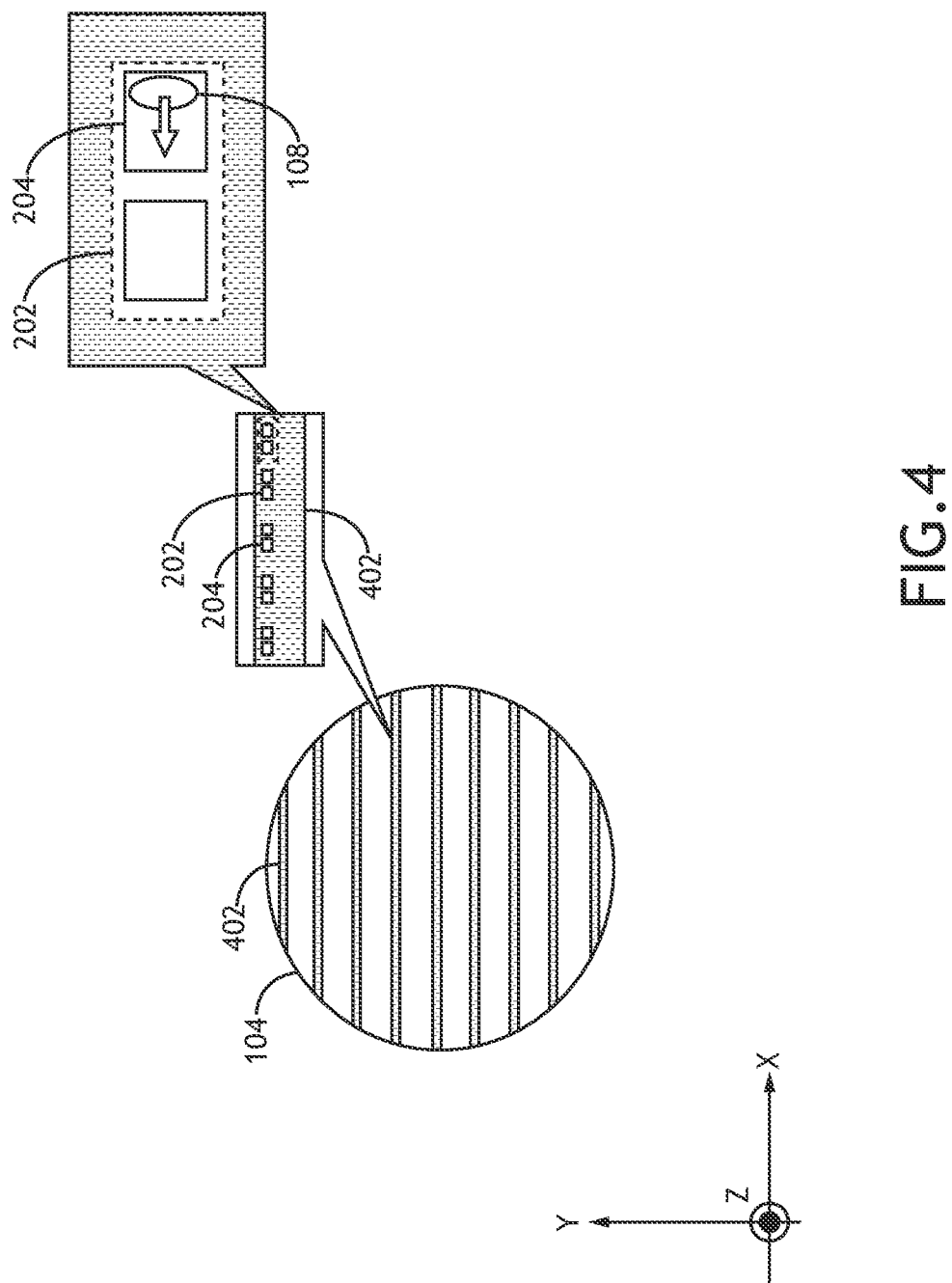
FIG. 4 is a conceptual view of a sample illustrating a placement of overlay targets and corresponding measurement paths to measure the overlay targets, in accordance with one or more embodiments of the present disclosure.

FIG. 4 is a conceptual view of a sample 104 illustrating a placement of overlay targets 204 and corresponding measurement paths 402 (e.g., swaths) to measure the overlay targets 204, in accordance with one or more embodiments of the present disclosure.

In some embodiments, multiple overlay targets 204 are distributed across the sample 104 at locations suitable for overlay measurements including, but not limited to, scribe lines. Further, various measurement paths 402 defining scan paths are defined to provide measurements of selected overlay targets 204 across the sample 104. For example, FIG. 4 illustrates multiple measurement paths 402 along the Y direction to measure various overlay targets 204.

An overlay target 204 may include any number of cells 202, where each cell 202 may include a Moiré structure having a periodicity along any selected direction. In this regard, various designs of overlay targets 204 may be utilized within the spirit and scope of the present disclosure. For example, the overlay targets 204 in FIG. 4 are illustrated as having two cells 202 distributed along the X direction.

In some embodiments, an overlay target 204 includes a first set of one or more cells 202 where each cell 202 has a Moiré structure with a periodicity along a first direction and a second set of one or more cells 202 where each cell 202 has a Moiré structure 206 with a periodicity along a second direction. Further, the second direction may be, but is not required to be, orthogonal to the first direction. In this way, the first set of one or more cells 202 may be suitable for overlay measurements along the first direction and the second set of one or more cells 202 may be suitable for overlay measurements along the second direction such that a full 2D overlay measurement may be obtained.

In a general sense, providing multiple cells 202 in an overlay target 204 suitable for measurement along a particular direction may facilitate a measurement over a larger area than provided by a single cell 202, which may improve the accuracy and/or sensitivity of the measurement. Further, the various cells 202 suitable for measurement along a particular direction may be distributed along the measurement direction and/or along a direction orthogonal to the measurement direction.

Figure 5:
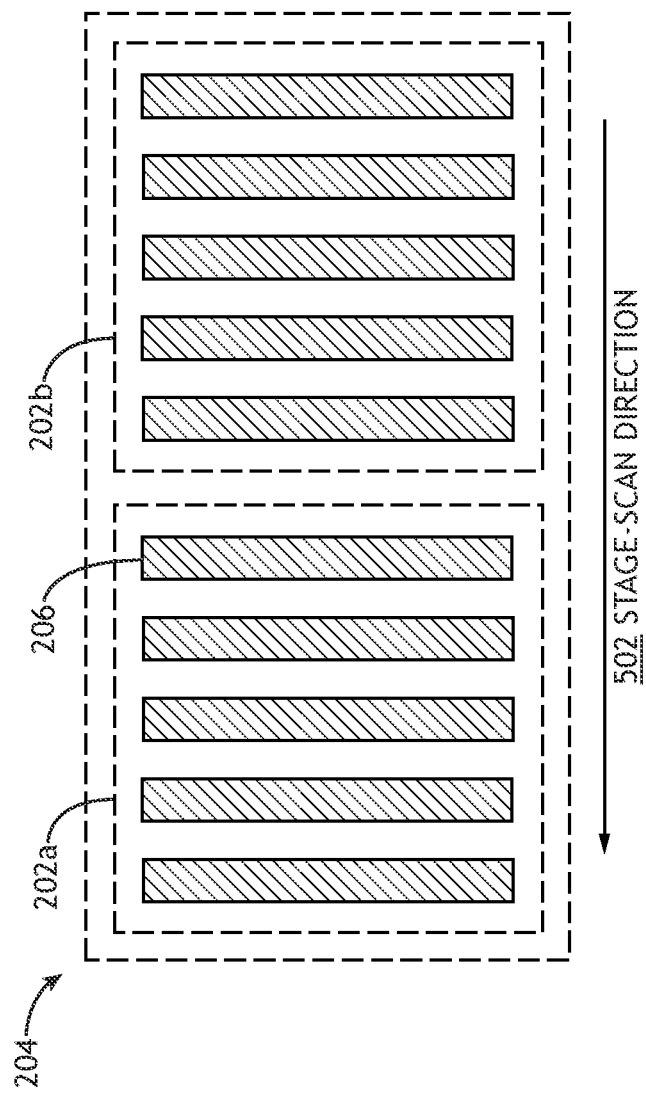
FIG. 5 is a top view of a 1D overlay target including two cells aligned along a stage-scan direction, where each of the cells has a Moiré structure having a periodicity along the stage-scan direction, in accordance with one or more embodiments of the present disclosure.
Figure 6A:
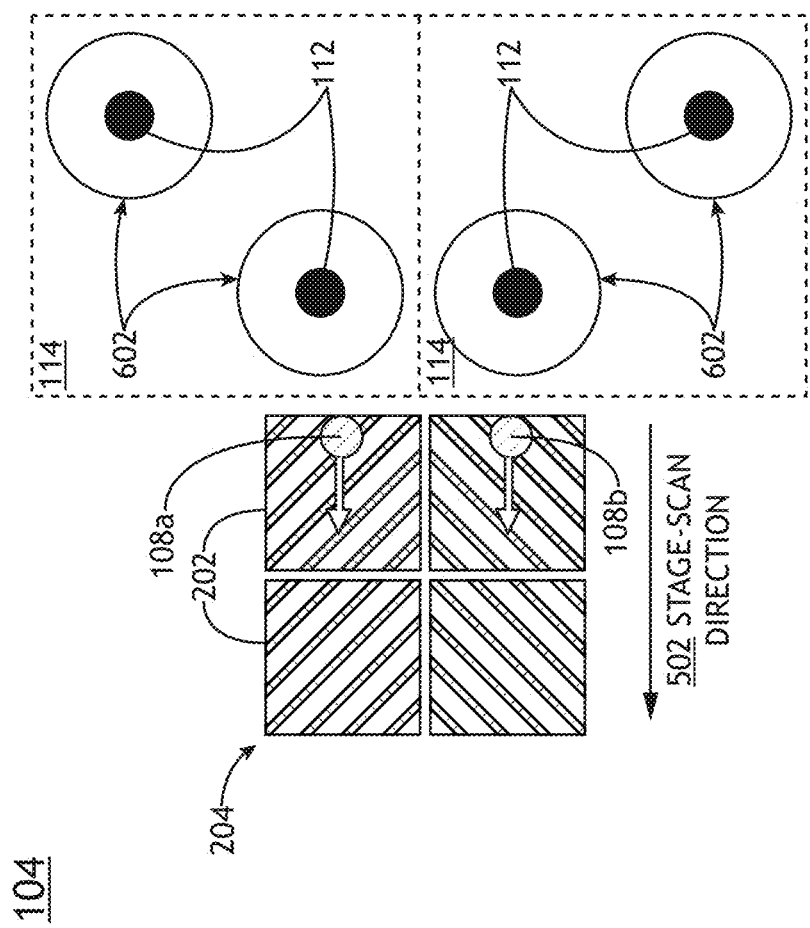
FIG. 6A is a top view of a first 2D overlay target having cells with periodicities oriented diagonally with respect to a stage-scan direction, in accordance with one or more embodiments of the present disclosure.
Figure 6B:
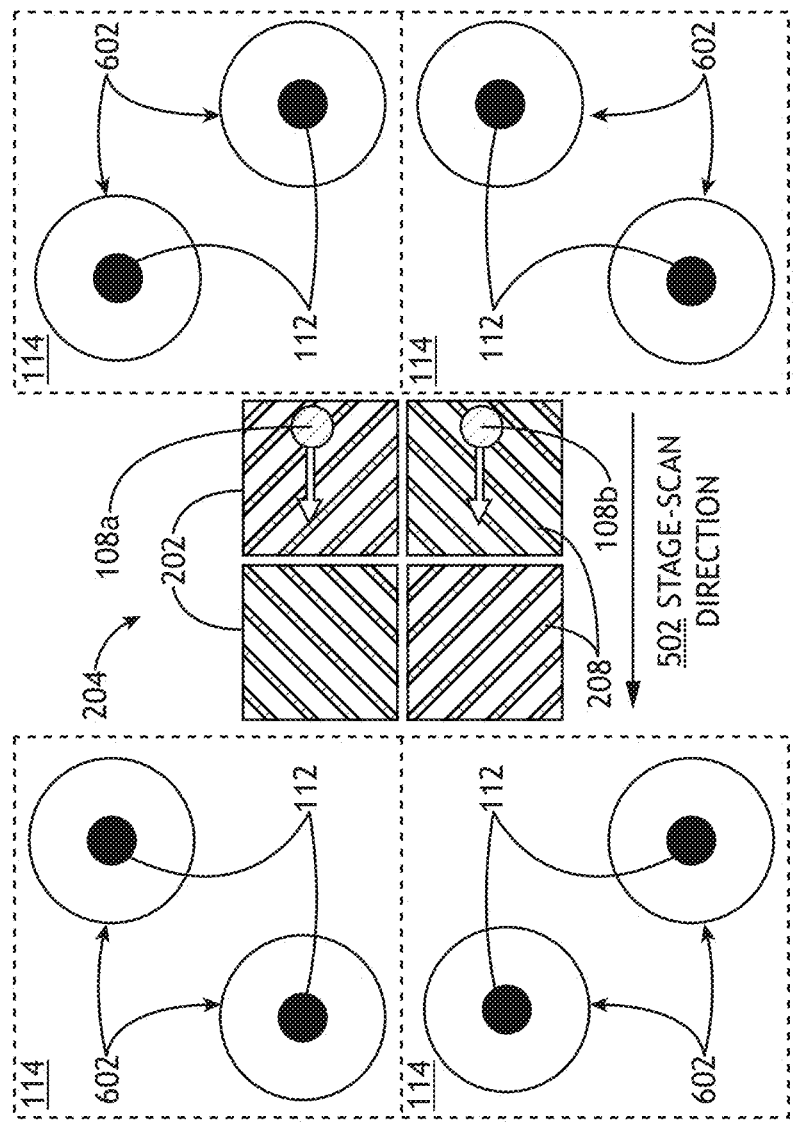
FIG. 6B is a top view of a second 2D overlay target having cells with periodicities oriented diagonally with respect to a stage-scan direction, in accordance with one or more embodiments of the present disclosure.

Referring now to FIGS. 5-6B, designs of overlay targets 204 suitable for overlay measurements along one or two directions using a stationary illumination beam 108 (e.g., without the use of a beam-scanning sub-system 118) are described in greater detail in accordance with one or more embodiments of the present disclosure.

FIG. 5 is a top view of a 1D overlay target 204 including two cells 202 aligned along a stage-scan direction 502, where each of the cells 202 has a Moiré structure 206 having a periodicity along the stage-scan direction 502, in accordance with one or more embodiments of the present disclosure. In this way, the stage-scan direction 502 and the measurement direction associated with the periodicity of the Moiré structures 206 in the cells 202 are fully aligned. In this configuration, a first set of measurement paths 402 may be generated to measure overlay targets 204 configured for measurement in one direction (e.g., the X direction) and a second set of measurement paths 402 may be generated to measure overlay targets 204 configured for measurement in a second direction (e.g., the Y direction) to provide 2D overlay measurements of the sample 104. It is contemplated herein that such an orientation may be suitable for, but not limited to, a vertical target structure as that illustrated in FIG. 2C having a controlled separation between the respective cells 202 along the stage-scan direction 502.

FIGS. 6A and 6B illustrate 2D overlay targets 204 having Moiré structures 206 that are periodic along diagonal directions with respect to the scan direction.

FIG. 6A is a top view of a first 2D overlay target 204 having cells 202 with periodicities oriented diagonally with respect to a stage-scan direction 502, in accordance with one or more embodiments of the present disclosure. FIG. 6B is a top view of a second 2D overlay target 204 having cells 202 with periodicities oriented diagonally with respect to a stage-scan direction 502, in accordance with one or more embodiments of the present disclosure. Offset images in FIGS. 6A and 6B illustrate a distribution of diffracted orders 602 of interest in the collection pupil plane 114, as well as the corresponding locations of the pairs of photodetectors 112, for the corresponding cells 202. For example, the distribution of the diffraction orders illustrated in the offset images in FIGS. 6A and 6B may be substantially similar to FIG. 3C, where the Moiré diffraction orders (e.g., −1 order Moiré diffraction 308 and +1 order Moiré diffraction 310) are rotated based on the direction of periodicity of each cell 202. However, it is to be understood that FIGS. 6A and 6B are not limited by the particular arrangement of FIG. 3C and may include other arrangements such as, but not limited to, those illustrated in FIGS. 3B and 3D.

For example, an overlay target 204 in FIGS. 6A and 6B may be suitable for measurements of overlapping first-order diffraction from top and bottom gratings of Moiré structures 206 as illustrated in FIG. 3D. By way of another example, an overlay target 204 in FIGS. 6A and 6B may be suitable for measurements of overlapping 0-order light and Moiré diffraction (e.g., −1 order Moiré diffraction 308 and +1 order Moiré diffraction 310).

In FIGS. 6A and 6B, the overlay target 204 includes a first set of cells 202 distributed along the stage-scan direction 502 that may be illuminated with a first illumination beam 108a and a second set of cells 202 distributed along the stage-scan direction 502 that may be illuminated with a second illumination beam 108b. Further, the first and second sets of cells 202 are offset along a direction orthogonal to the stage-scan direction 502. In this way, both illumination beams 108a,b may simultaneously probe separate cells 202 as the sample 104 is scanned.

Further, FIGS. 6A and 6B illustrate various non-limiting configurations of cells 202 having periodicities in two orthogonal directions suitable for 2D overlay measurements. In FIG. 6A, cells 202 oriented to have periodicity along a common diagonal direction are grouped into rows. In this regard, the orientation of the diffraction orders and thus the orientations of the photodetectors 112 required to obtain measurements for the cells 202 are constant for each row as illustrated in the offset images in FIG. 6A. In FIG. 6B, each illumination beam 108 scans across cells 202 having periodicities in both diagonal directions. In this way, systematic errors associated with a particular illumination beam 108 may be mitigated. However, as illustrated in the offset images in FIG. 6B, the orientation of the photodetectors 112 may be different for different cells 202 along the stage-scan direction 502. In some embodiments, the collection sub-system 110 is configured with a single collection channel 144 having suitably placed photodetectors 112 in overlap areas associated with both diagonal directions. The controller 122 may then selectively analyze the corresponding pairs of photodetectors 112 associated with each cell 202 when generating an overlay measurement. In some embodiments, the collection sub-system 110 is configured with two collection channels 144, each with a pair of photodetectors 112 in overlap areas associated with a single diagonal direction. The controller 122 may then selectively analyze the corresponding collection channel 144 associated with each cell 202 when generating an overlay measurement.

It is recognized herein that in some applications it may be desirable or customary to provide overlay measurements along the stage-scan direction 502. Accordingly, overlay measurements along the first and second diagonal directions may be transformed using linear transformations to provide overlay measurements along any desired directions on the sample 104.

Referring now to FIGS. 7A-8B, designs of overlay targets 204 suitable for overlay measurements in which a beam-scanning sub-system 118 scans one or more illumination beams 108 during a measurement are described in greater detail in accordance with one or more embodiments of the present disclosure. In FIGS. 7A-8B, the beam-scanning sub-system 118 scans one or more illumination beams 108 along a beam-scan direction 702 different than the stage-scan direction 502 (e.g., orthogonal to the stage-scan direction 502) as the sample 104 is scanned along the stage-scan direction 502. In this way, each illumination beam 108 may be scanned across the overlay target 204 (or a cell 202 thereof) along a diagonal path.

Figure 7B:
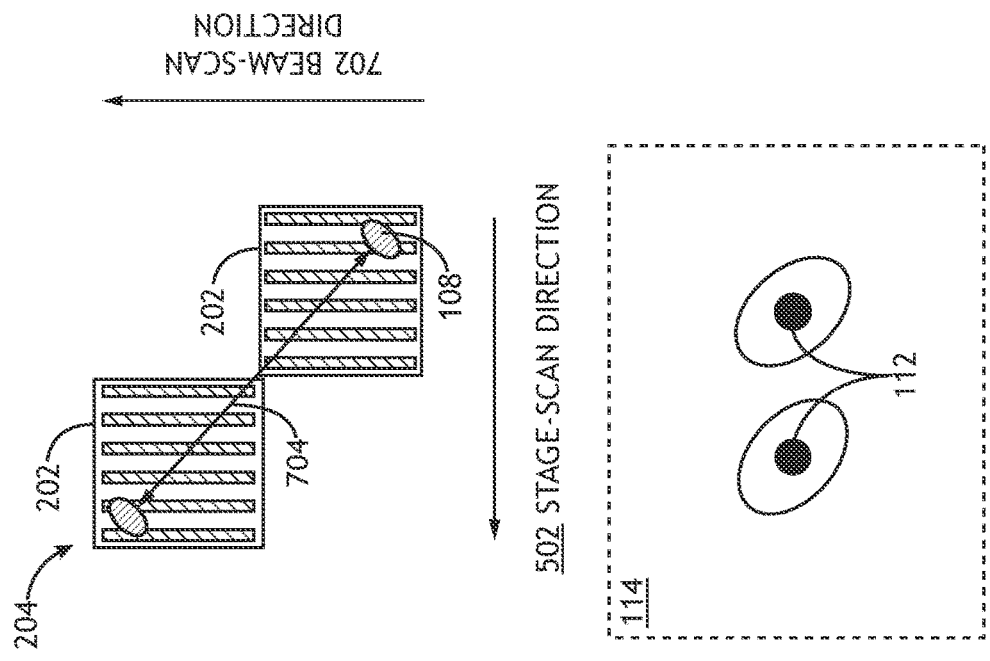
FIG. 7B is a top view of a second overlay target suitable for overlay measurements along the X direction with an illumination beam being scanned along the +Y direction, in accordance with one or more embodiments of the present disclosure.
Figure 7A:
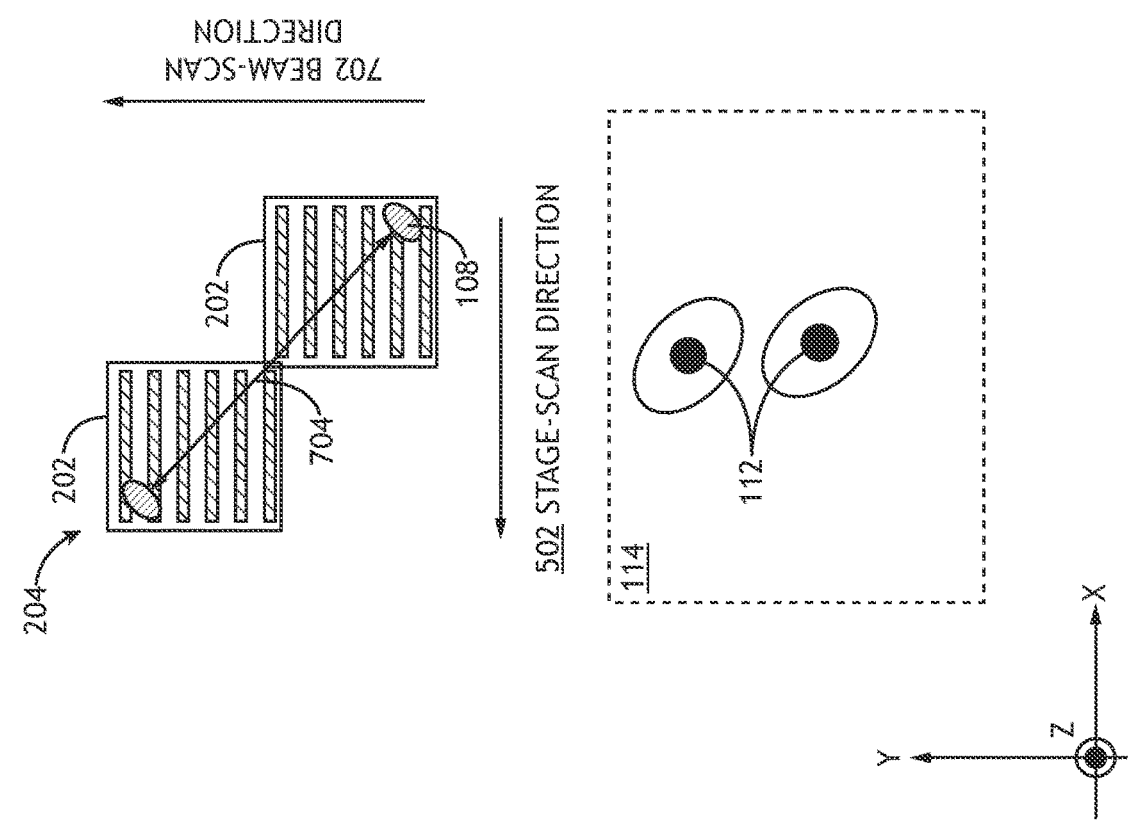
FIG. 7A is a top view of a first overlay target suitable for overlay measurements along the Y direction with an illumination beam being scanned along the +Y direction, in accordance with one or more embodiments of the present disclosure.

FIGS. 7A-7D illustrate 1D overlay targets 204 suitable for overlay measurements along the X and Y directions, in accordance with one or more embodiments of the present disclosure. FIG. 7A is a top view of a first overlay target 204 suitable for overlay measurements along the Y direction with an illumination beam 108 being scanned along the +Y direction, in accordance with one or more embodiments of the present disclosure. FIG. 7B is a top view of a second overlay target 204 suitable for overlay measurements along the X direction with an illumination beam 108 being scanned along the +Y direction, in accordance with one or more embodiments of the present disclosure. In FIGS. 7A and 7B, scanning speeds along the stage-scan direction 502 and the beam-scan direction 702 may be selected such that an illumination beam 108 propagates across opposing corners of a cell 202 along a first diagonal direction 704. In this way, multiple cells 202 may be distributed along the first diagonal direction 704, which may increase the effective measurement area of the overlay target 204 and thus improve the overlay measurement.

Figure 7D:
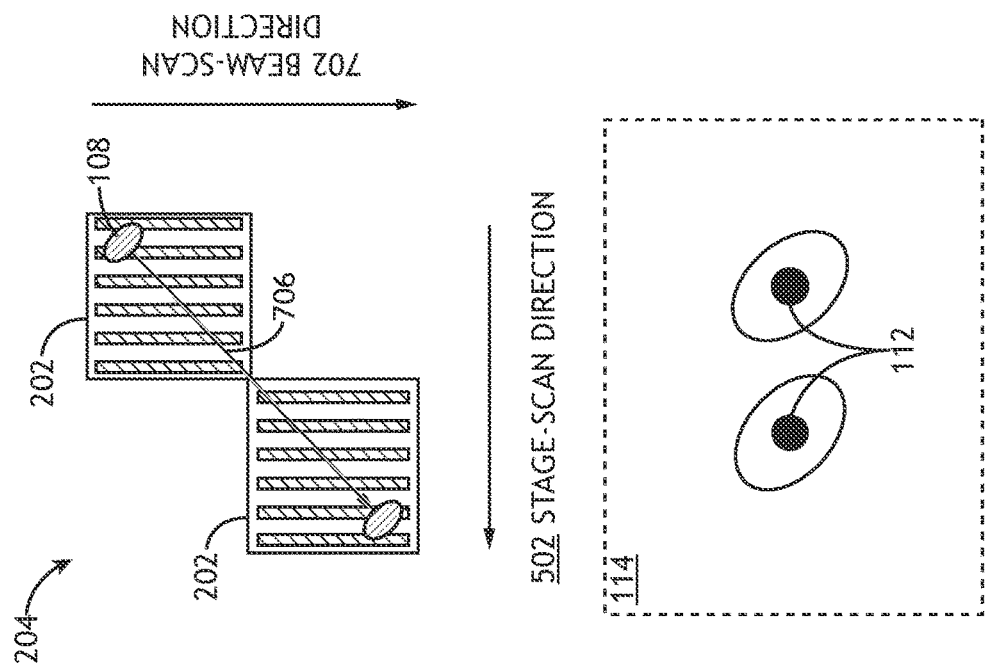
FIG. 7D is a top view of a second overlay target suitable for overlay measurements along the X direction with an illumination beam being scanned along the −Y direction, in accordance with one or more embodiments of the present disclosure.
Figure 7C:
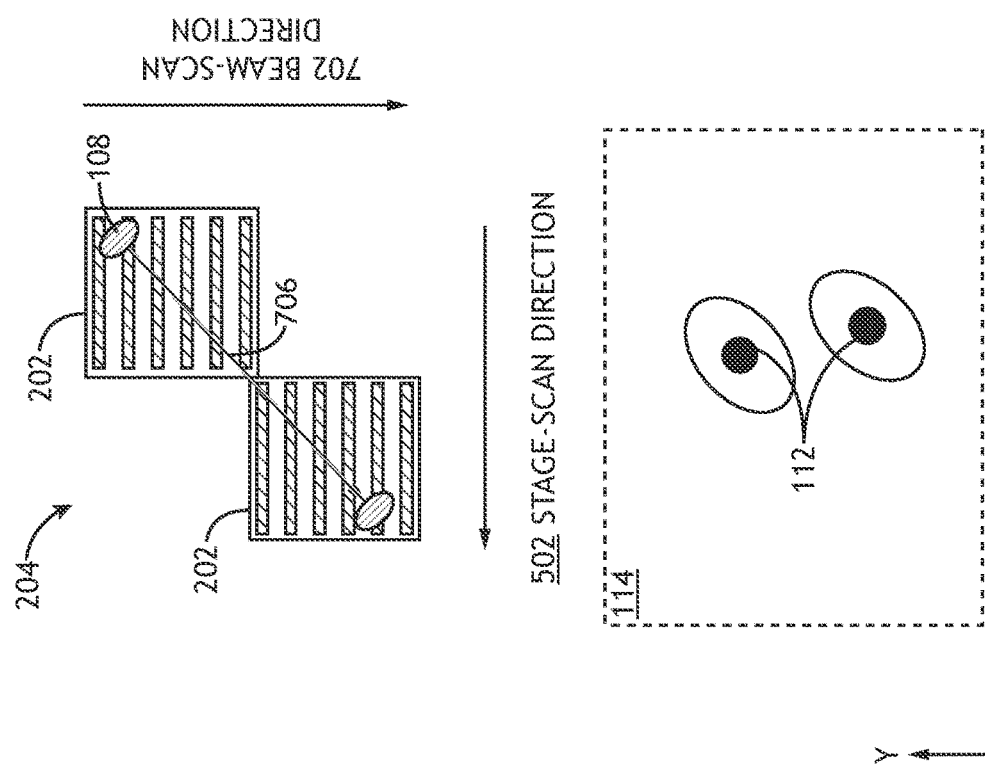
FIG. 7C is a top view of a first overlay target suitable for overlay measurements along the Y direction with an illumination beam being scanned along the −Y direction, in accordance with one or more embodiments of the present disclosure.

FIGS. 7C and 7D illustrate similar overlay targets 204 suitable for beam scanning along the −Y direction. FIG. 7C is a top view of a first overlay target 204 suitable for overlay measurements along the Y direction with an illumination beam 108 being scanned along the −Y direction, in accordance with one or more embodiments of the present disclosure. FIG. 7D is a top view of a second overlay target 204 suitable for overlay measurements along the X direction with an illumination beam 108 being scanned along the −Y direction, in accordance with one or more embodiments of the present disclosure. As in FIGS. 7A and 7B, scanning speeds along the stage-scan direction 502 and the beam-scan direction 702 may be selected such that an illumination beam 108 propagates across opposing corners of a cell 202 along a second diagonal direction 706 and multiple cells 202 may be distributed along the second diagonal direction 706.

Offset images in FIGS. 7A-7D depict the distribution of diffraction orders and the placement of the photodetectors 112 in the collection pupil plane 114 for measurement with the respective overlay targets 204. For example, the distribution of the diffraction orders illustrated in the offset images in FIGS. 7A-7D may be substantially similar to FIG. 3C, where the Moiré diffraction orders (e.g., −1 order Moiré diffraction 308 and +1 order Moiré diffraction 310) are rotated based on the direction of periodicity of each cell 202. However, it is to be understood that FIGS. 7A-7D are not limited by the particular arrangement of FIG. 3C. For example, an overlay target 204 in FIGS. 7A-7D may be suitable for measurements of overlapping first-order diffraction from top and bottom gratings of Moiré structures 206 as illustrated in FIG. 3D. By way of another example, an overlay target 204 in FIGS. 7A-7D may be suitable for measurements of overlapping 0-order light and Moiré diffraction (e.g., −1 order Moiré diffraction 308 and +1 order Moiré diffraction 310) as illustrated in FIG. 3B.

Additionally, FIGS. 7A-7D illustrate the use of elongating the illumination beam 108 in order to mitigate the impact of target roughness as described previously herein. As a non-limiting example, the illumination beam 108 in FIGS. 7A-7D is sized to 0.5×1 micrometer, which may be achieved by an oval pupil of 0.9×0.45 NA. Accordingly, the offset images illustrate the associated effect on the distribution of the diffraction orders in the collection pupil plane 114.

In some embodiments, an illumination beam 108 is oscillated along the beam-scan direction 702 (e.g., by an oscillating deflector in the beam-scanning sub-system 118). In this regard, the illumination beam 108 may trace a path similar to a triangle wave on the sample 104. Accordingly, multiple overlay targets 204 (or multiple combinations of cells 202 thereof) may be distributed along the triangle wave pattern of the illumination beam 108 to facilitate successive measurements. For example, overlay targets 204 illustrated in FIGS. 7A and 7B may be interleaved with overlay targets 204 illustrated in FIGS. 7C and 7D. Continuing the non-limiting example of 10 micrometer square cells 202, this may be achieved by selecting a 10 cm/second speed along the stage-scan direction 502 and a 10 kHz resonant frequency along the beam-scan direction 702.

Figure 8A:
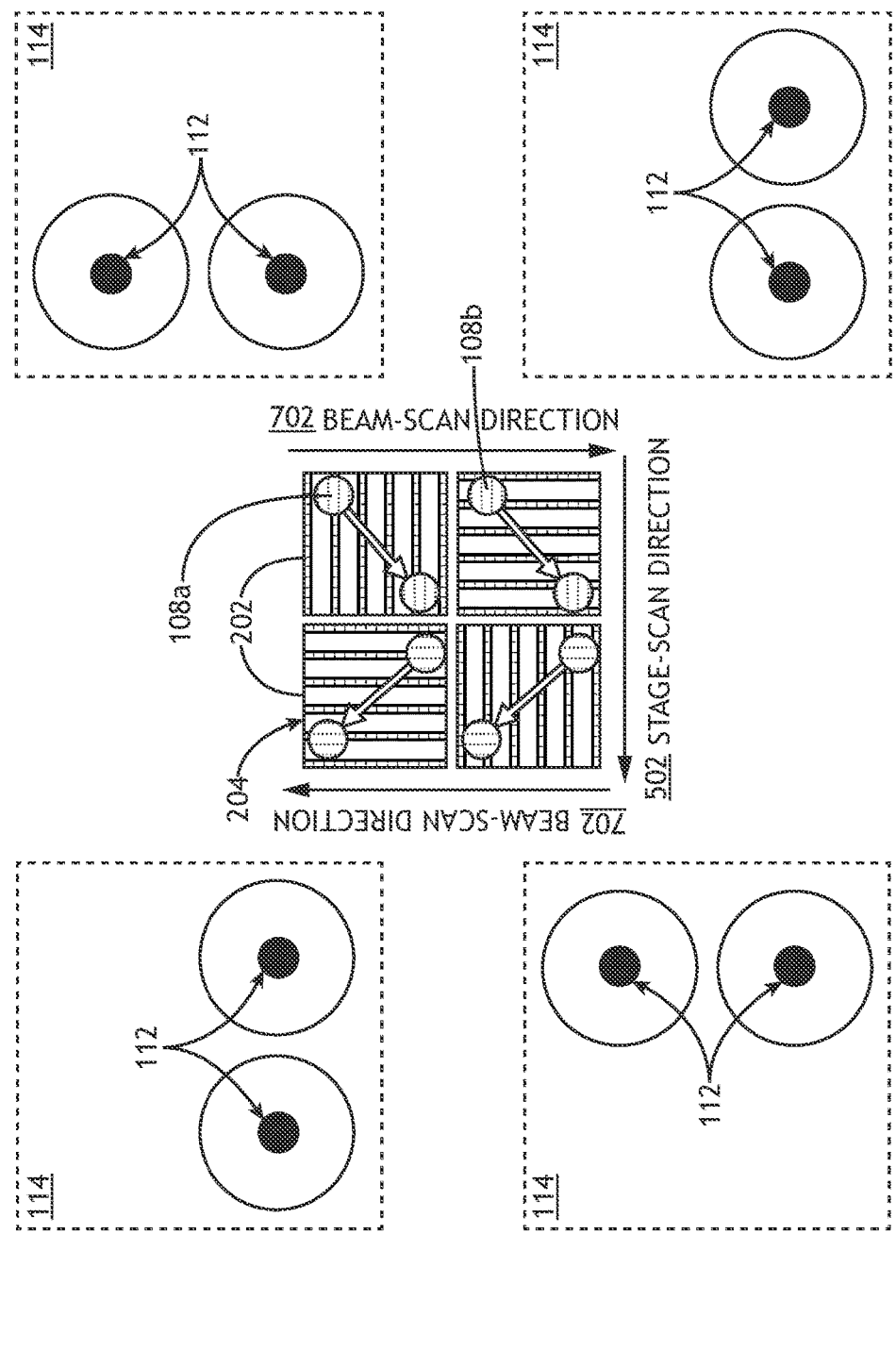
FIG. 8A is a top view of a first overlay target suitable for 2D overlay measurements of two parallel illumination beams, in accordance with one or more embodiments of the present disclosure.
Figure 8B:
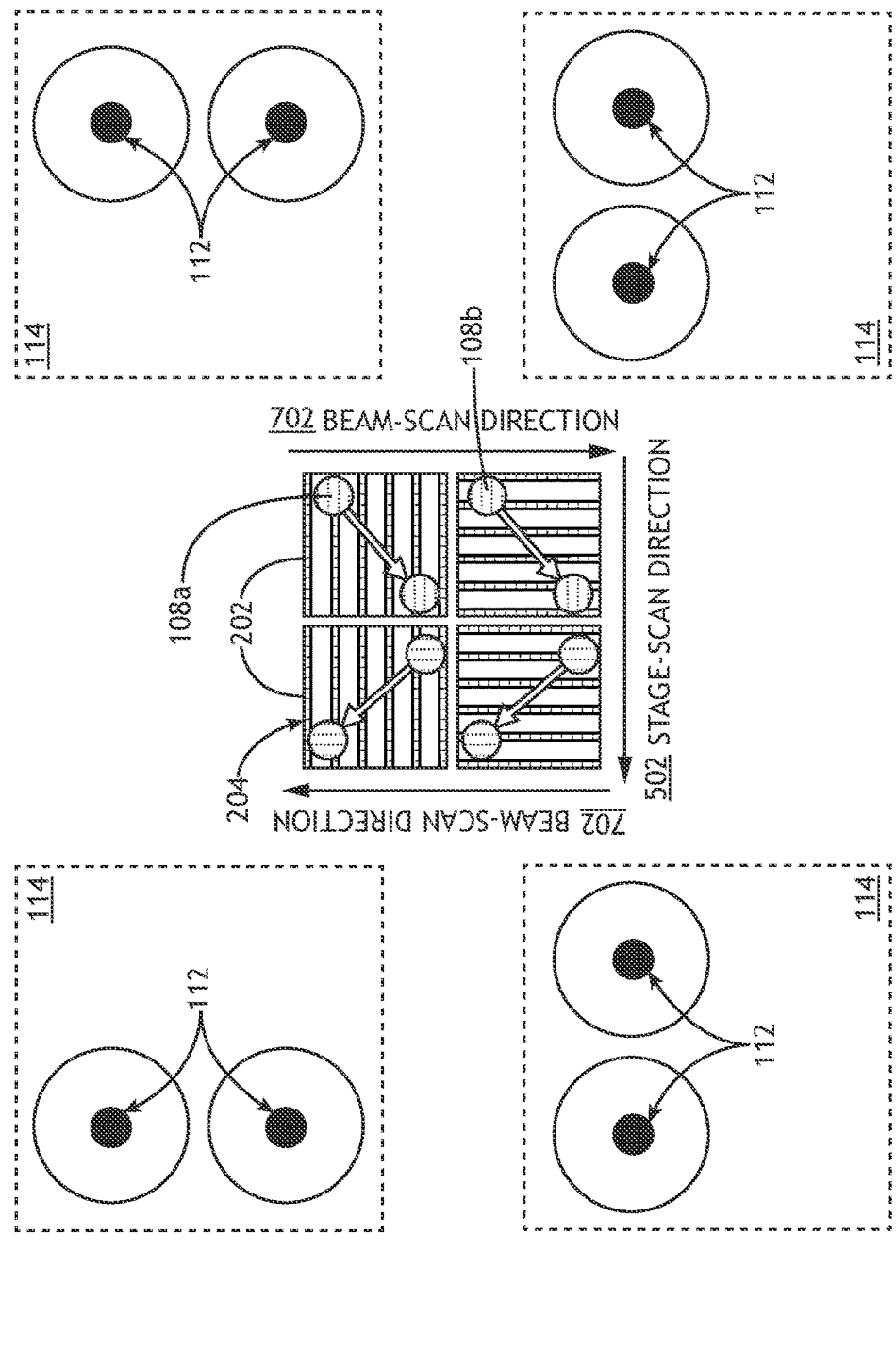
FIG. 8B is a top view of a second overlay target suitable for 2D overlay measurements of two parallel illumination beams, in accordance with one or more embodiments of the present disclosure.

Referring now to FIGS. 8A and 8B, overlay targets 204 suitable for 2D overlay measurements using beam scanning are described in accordance with one or more embodiments of the present disclosure. FIG. 8A is a top view of a first overlay target 204 suitable for 2D overlay measurements of two parallel illumination beams 108, in accordance with one or more embodiments of the present disclosure. FIG. 8B is a top view of a second overlay target 204 suitable for 2D overlay measurements of two parallel illumination beams 108, in accordance with one or more embodiments of the present disclosure. In both FIGS. 8A and 8B, a first illumination beam 108a traces a triangle-wave path across cells 202 in a first row and a second illumination beam 108b traces a triangle-wave path across cells 202 in a second row. Continuing the non-limiting example of 10 micrometer square cells 202, this may be achieved by selecting a 10 cm/second speed along the stage-scan direction 502 and a 20 kHz resonant frequency along the beam-scan direction 702.

Further, the offset images in FIGS. 8A and 8B illustrate the corresponding distributions of diffraction orders and the placement of photodetectors 112 in the collection pupil plane 114 associated with measurements of the various cells 202. For example, the distribution of the diffraction orders illustrated in the offset images in FIGS. 8A and 8B may be substantially similar to FIG. 3C, where the Moiré diffraction orders (e.g., −1 order Moiré diffraction 308 and +1 order Moiré diffraction 310) are rotated based on 8A and 8B are not limited by the particular arrangement of FIG. 3C. However, it is to be understood that FIGS. 8A and 8B are not limited by the particular arrangement of FIG. 3C. For example, an overlay target 204 in FIGS. 8A and 8B may be suitable for measurements of overlapping first-order diffraction from top and bottom gratings of Moiré structures 206 as illustrated in FIG. 3D. By way of another example, an overlay target 204 in FIGS. 8A and 8B may be suitable for measurements of overlapping 0-order light and Moiré diffraction (e.g., −1 order Moiré diffraction 308 and +1 order Moiré diffraction 310) as illustrated in FIG. 3B. It is further noted that the illumination beams 108 are illustrated as circular in FIGS. 8A and 8B, but it should be understood that the illumination beams 108 may be elongated to mitigate noise associated with target roughness as described previously herein.

In FIG. 8A, cells 202 with a common direction of periodicity are diagonally distributed in the overlay target 204. However, it is contemplated herein that the signal strength of diffracted orders may depend on the polarization of the illumination beam 108 and the direction of periodicity. As described previously herein, in some embodiments, simultaneous measurements of multiple cells 202 with multiple illumination beams 108 (e.g., as illustrated by FIGS. 8A and 8B, as well as FIGS. 6A and 6B above) is implemented by separating the diffraction orders associated with the multiple illumination beams 108 into separate collection channels 144. This separation may be efficiently achieved by differentiating the illumination beams 108 by polarization, color, or some other parameter and providing corresponding elements in the collection sub-system 110 to separate the resulting diffraction orders (e.g., polarization filters, polarizing beamsplitters, spectral filters, spectral beamsplitters, or the like). However, the layout illustrated in FIG. 8A provides that each illumination beam 108 interrogates one X-direction cell 202 and one Y-direction cell 202, which may introduce disparities in the associated signals for the two illumination beams 108. In some embodiments, such disparities are mitigated algorithmically. In some embodiments, the optical configuration of each illumination beam 108 may be alternated or otherwise switched to provide for common measurement conditions for cells having a common direction of periodicity.

However, the overlay target 204 illustrated in FIG. 8B is arranged such that cells 202 with a common direction of periodicity are interrogated by common illumination beams 108. In this way, measurements of various cells 202 with a common direction of periodicity may be performed using common measurement conditions, which may improve the accuracy of the overlay measurement.

Figure 9:
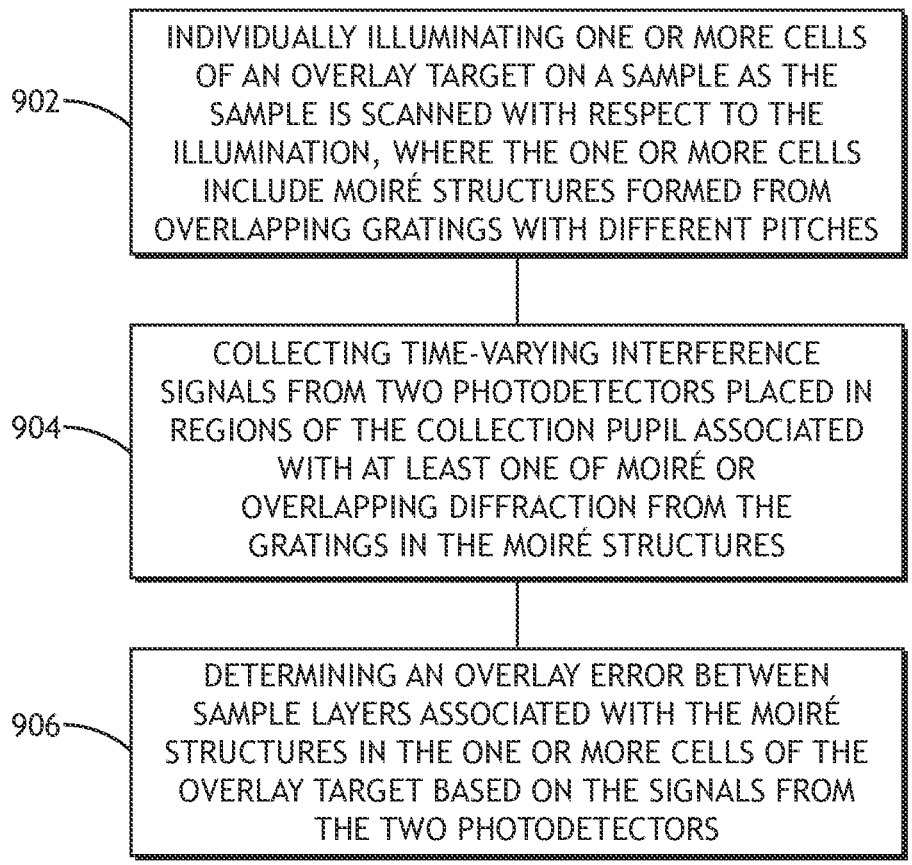
FIG. 9 is a flow diagram illustrating steps performed in a method for scanning overlay metrology of overlay targets with at least one Moiré structure, in accordance with one or more embodiments of the present disclosure.

FIG. 9 is a flow diagram illustrating steps performed in a method 900 for scanning overlay metrology of overlay targets with at least one Moiré structure, in accordance with one or more embodiments of the present disclosure. Applicant notes that the embodiments and enabling technologies described previously herein in the context of the overlay metrology system 100 should be interpreted to extend to the method 900. It is further noted, however, that the method 900 is not limited to the architecture of the overlay metrology system 100.

In some embodiments, the method 900 includes a step 902 of illuminating one or more cells of an overlay target on a sample as the sample is scanned with respect to the illumination, wherein the one or more cells include Moiré structures formed from overlapping gratings with different pitches.

In some embodiments, the method 900 includes a step 904 of collecting time-varying interference signals from two photodetectors placed in regions of the collection pupil associated with at least one of Moiré diffraction (e.g., combined diffraction, double diffraction, or the like) or overlapping diffraction from the gratings in the Moiré structures. For example, non-limiting configurations may include, but are not limited to, photodetectors may be placed at locations including exclusively Moiré diffraction orders, both Moiré diffraction orders and 0-order diffraction, or first-order diffraction from top and bottom gratings of a Moiré structure.

In some embodiments, the method 900 includes a step 906 of determining an overlay error between sample layers associated with the Moiré structures in the one or more cells of the overlay target based on the signals from the two photodetectors. For example, an overlay error along a direction of periodicity of the Moiré structures may be proportional to a phase difference between the time-varying interference signals from the two photodetectors. The phase difference may be determined using any technique known in the art including, but not limited to, phase-locking techniques applied to the two time-varying interference signals. Further, overlay measurements of the sample along a particular measurement direction may be generated based on data from multiple cells of the overlay target with Moiré structures having periodicity along the particular measurement direction.

It is contemplated herein that the method 900 may be applied to a wide variety of overlay target designs suitable for 1D or 2D metrology measurements. In some embodiments, the method 900 includes simultaneously scanning multiple illumination beams and collecting the associated overlapping diffraction orders for parallel measurements. In some embodiments, the method 900 includes scanning one or more illumination beams along a beam-scan direction different than the stage-scan direction to provide a diagonal or triangle-wave path across the sample. In this regard, cells having Moiré structures with different directions of periodicity may be efficiently interrogated by a common illumination beam in a measurement swath.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
   an illumination sub-system configured to implement a metrology recipe, the illumination sub-system comprising:
   an illumination source configured to generate an illumination beam; and
   one or more illumination optics configured to direct the illumination beam to an overlay target on a sample as the sample is scanned relative to the illumination beam along a scan direction when implementing the metrology recipe, wherein the overlay target in accordance with the metrology recipe includes one or more cells having Moiré structures formed as overlapping grating structures with different pitches on a first layer and a second layer of the sample, wherein the overlapping grating structures are periodic along at least one of the scan direction or a direction orthogonal to the scan direction;

a collection sub-system configured to implement the metrology recipe, the collection sub-system comprising:

a first photodetector located in a pupil plane at a first location to capture at least one of Moiré diffraction orders or overlapping diffraction orders from the Moiré structures in the one or more cells when implementing the metrology recipe; and a second photodetector located in the pupil plane at a second location to capture at least one of Moiré diffraction orders or overlapping diffraction orders from the Moiré structures in the one or more cells when implementing the metrology recipe; and a controller communicatively coupled to the first photodetector and the second photodetector, the controller including one or more processors configured to execute program instructions causing the one or more processors to:

receive time-varying interference signals from the first photodetector and the second photodetector associated with the Moiré structures in the one or more cells as the overlay target is scanned in accordance with the metrology recipe; and determine an overlay error between the first layer and the second layer of the sample based on the time-varying interference signals.

2. The overlay metrology system of claim 1, wherein the first location including the first photodetector includes a location of +1 Moiré order diffraction associated with Moiré diffraction from the overlapping grating structures of the Moiré structures and 0-order diffraction, wherein the second location including the second photodetector includes a location of −1 Moiré order diffraction associated with Moiré diffraction from the overlapping grating structures of the Moiré structures and 0-order diffraction.

3. The overlay metrology system of claim 2, wherein at least one of a first pitch or a second pitch of the overlapping grating structures is not resolved by the overlay metrology system.

4. The overlay metrology system of claim 1, wherein the first location including the first photodetector includes a location of +1 Moiré order diffraction associated with Moiré diffraction from the overlapping grating structures of the Moiré structures, wherein the second location including the second photodetector includes a location of −1 Moiré order diffraction associated with Moiré diffraction from the overlapping grating structures of the Moiré structures.

5. The overlay metrology system of claim 1, wherein the first location including the first photodetector includes a location of overlap between +1-order diffraction from the overlapping grating structures of the Moiré structures, wherein the second location including the second photodetector includes a location of overlap between −1-order diffraction from the from the overlapping grating structures of the Moiré structures.

6. The overlay metrology system of claim 1, wherein the first photodetector and the second photodetector comprise:

phase-locked photodetectors locked to a frequency of the time-varying interference signals, wherein the one or more processors are further configured to execute program instructions causing the one or more processors to:

extract at least one of intensity or phase information associated with the time-varying interference signals using a phase locking technique; and determine the overlay error between the first layer and the second layer of the sample based on the at least one of intensity or phase information.

7. The overlay metrology system of claim 1, wherein a spot size of an illumination lobe on the overlay target is elongated along a direction orthogonal to a stage-scan direction to provide target noise averaging.

8. The overlay metrology system of claim 1, wherein the one or more illumination optics direct the illumination beam to the overlay target at a normal incidence angle.

9. The overlay metrology system of claim 1, wherein the illumination beam comprises:

a spatially coherent illumination beam.

10. The overlay metrology system of claim 1, wherein the one or more cells of the overlay target comprise:

two cells including Moiré structures having periodicity along the scan direction, wherein determining the overlay error between the first layer and the second layer of the sample based on the time-varying interference signals comprises:

determining the overlay error between the first layer and the second layer of the sample along the scan direction based on the time-varying interference signals.

11. The overlay metrology system of claim 10, wherein the two cells comprise:

a first cell having a first Moiré structure formed as a first-layer grating on the first layer with a first pitch and a second-layer grating on the second layer with a second pitch; and a second cell having a second Moiré structure formed as a first-layer grating on the first layer with the second pitch and a second-layer grating on the second layer with the first pitch.

12. The overlay metrology system of claim 1, wherein the one or more cells of the overlay target comprise:

two cells including Moiré structures having periodicity along the direction orthogonal to the scan direction, wherein determining the overlay error between the first layer and the second layer of the sample based on the time-varying interference signals comprises:

determining the overlay error between the first layer and the second layer of the sample along the direction orthogonal to the scan direction based on the time-varying interference signals.

13. The overlay metrology system of claim 12, wherein the two cells comprise:

a first cell having a first Moiré structure formed as a first-layer grating on the first layer with a first pitch and a second-layer grating on the second layer with a second pitch; and a second cell having a second Moiré structure formed as a first-layer grating on the first layer with the second pitch and a second-layer grating on the second layer with the first pitch.

14. The overlay metrology system of claim 1, further comprising:

a translation stage to translate the sample along the scan direction, wherein the one or more illumination optics direct the illumination beam to the overlay target on the sample as the sample is scanned by the translation stage.

15. The overlay metrology system of claim 1, further comprising:

one or more beam-scanning optics to scan the illumination beam along the scan direction.

16. An overlay metrology system comprising:
an illumination sub-system configured to implement a metrology recipe, the illumination sub-system comprising:
   a first illumination channel and a second illumination channel configured to implement the metrology recipe by illuminating an overlay target on a sample with a first illumination beam and a second illumination beam as the sample is scanned along a stage-scan direction by a translation stage, wherein the overlay target in accordance with the metrology recipe comprises:
      a first set of cells including Moiré structures formed as overlapping grating structures on a first layer and a second layer of the sample with different pitches along a first direction; and
      a second set of cells including Moiré structures formed as overlapping grating structures on the first layer and the second layer of the sample with different pitches along a second direction orthogonal to the first direction, wherein the stage-scan direction is angled with respect to the first direction and the second direction,
      wherein the first illumination channel and the second illumination channel illuminate different cells of the overlay target separated along a direction orthogonal to the stage-scan direction;
a collection sub-system configured to implement the metrology recipe, the collection sub-system comprising:
a first detection channel and a second detection channel associated with the first illumination channel and the second illumination channel, respectively, wherein a particular detection channel comprises:
   a first photodetector located in a pupil plane at a first location to capture at least one of Moiré diffraction orders or overlapping diffraction orders from the Moiré structures in the overlay target when implementing the metrology recipe; and
   a second photodetector located in a pupil plane at a second location to capture at least one of Moiré diffraction orders or overlapping diffraction orders from the Moiré structures in the overlay target when implementing the metrology recipe; and
a controller communicatively coupled to the first photodetector and the second photodetector, the controller including one or more processors configured to execute program instructions causing the one or more processors to:
   receive time-varying interference signals from the first photodetector and the second photodetector of each of the first detection channel and the second detection channel as the overlay target is scanned when implementing the metrology recipe; and
   determine an overlay error between the first layer and the second layer of the sample based on the time-varying interference signals.

17. The overlay metrology system of claim 16, wherein the first set of cells of the overlay target are distributed along the stage-scan direction and are aligned with the first illumination channel, wherein the second set of cells of the overlay target are distributed along the stage-scan direction and are aligned with the second illumination channel.

18. The overlay metrology system of claim 16, wherein the first set of cells of the overlay target are distributed along a first diagonal direction with respect to the stage-scan direction, wherein one of the first set of cells is aligned with the first illumination channel and one of the first set of cells is aligned with the second illumination channel, wherein the second set of cells of the overlay target are distributed along a second diagonal direction orthogonal to the first diagonal direction, wherein one of the second set of cells is aligned with the first illumination channel and one of the second set of cells is aligned with the second illumination channel.

19. The overlay metrology system of claim 16, wherein the first set of cells comprises:
   a first cell having a first Moiré structure formed as a first-layer grating on the first layer with a first pitch and a second-layer grating on the second layer with a second pitch; and
   a second cell having a second Moiré structure formed as a first-layer grating on the first layer with the second pitch and a second-layer grating on the second layer with the first pitch, wherein the second set of cells comprises:
      a third cell having a third Moiré structure formed as a first-layer grating on the first layer with the first pitch and a second-layer grating on the second layer with the second pitch; and
      a fourth cell having a fourth Moiré structure formed as a first-layer grating on the first layer with the second pitch and a second-layer grating on the second layer with the first pitch.

20. The overlay metrology system of claim 16, wherein the first location including the first photodetector includes a location of +1 Moiré order diffraction associated with Moiré diffraction from the overlapping grating structures of the Moiré structures, wherein the second location including the second photodetector includes a location of −1 Moiré order diffraction associated with Moiré diffraction from the overlapping grating structures of the Moiré structures.

21. The overlay metrology system of claim 16, wherein the first location including the first photodetector includes a location of overlap between 0-order light and +1 Moiré order diffraction associated with Moiré diffraction from the overlapping grating structures of the Moiré structures, wherein the second location including the second photodetector includes a location of overlap between 0-order light and −1 Moiré order diffraction associated with Moiré diffraction from the overlapping grating structures of the Moiré structures.

22. The overlay metrology system of claim 21, wherein at least one of a first pitch or a second pitch of the overlapping grating structures is not resolved by the overlay metrology system.

23. The overlay metrology system of claim 16, wherein the first location including the first photodetector includes a location of overlap between +1-order diffraction from the overlapping grating structures of the Moiré structures, wherein the second location including the second photodetector includes a location of overlap between −1-order diffraction from the overlapping grating structures of the Moiré structures.

24. The overlay metrology system of claim 16, wherein the first photodetector and the second photodetector of each of the first detection channel and the second detection channel comprise:
   phase-locked photodetectors locked to a frequency of the time-varying interference signals, wherein the one or more processors are further configured to execute program instructions causing the one or more processors to:

extract at least one of intensity or phase information associated with the time-varying interference signals using a phase locking technique; and determine the overlay error between the first layer and the second layer of the sample based on the at least one of intensity or phase information.

25. The overlay metrology system of claim 16, wherein the first illumination beam has a polarization orthogonal to a polarization of the second illumination beam.

26. The overlay metrology system of claim 16, wherein the first illumination beam has a different wavelength than the second illumination beam.

27. The overlay metrology system of claim 16, wherein the first illumination beam and the second illumination beam comprise:

spatially coherent illumination beams.

28. An overlay metrology system comprising:
an illumination sub-system configured to implement a metrology recipe, the illumination sub-system comprising:
an illumination source configured to generate an illumination beam; and
a deflector configured to scan the illumination beam along a beam-scan direction across an overlay target on a sample as the sample is translated along a stage-scan direction orthogonal to the beam-scan direction by a translation stage when implementing the metrology recipe, wherein the overlay target in accordance with the metrology recipe includes one or more cells having Moiré structures formed as overlapping grating structures with different pitches on a first layer and a second layer, wherein the overlapping grating structures are periodic along at least one of the stage-scan direction or a direction orthogonal to the stage-scan direction, wherein the one or more cells are distributed along a diagonal direction angled with respect to the stage-scan direction;
a collection sub-system configured to implement the metrology recipe, the collection sub-system comprising:
a first photodetector located in a pupil plane at a first location to capture at least one of Moiré diffraction orders or overlapping diffraction orders from the Moiré structures in the one or more cells when implementing the metrology recipe; and
a second photodetector located in a pupil plane at a second location to capture at least one of Moiré diffraction orders or overlapping diffraction orders from the Moiré structures in the one or more cells when implementing the metrology recipe; and
a controller communicatively coupled to the first photodetector and the second photodetector, the controller including one or more processors configured to execute program instructions causing the one or more processors to:
receive time-varying interference signals from the first photodetector and the second photodetector as the overlay target is scanned in accordance with the metrology recipe; and
determine an overlay error between the first layer and the second layer of the sample based on the time-varying interference signals.

29. The overlay metrology system of claim 28, wherein the first location including the first photodetector includes a location of +1 Moiré order diffraction associated with Moiré diffraction from the overlapping grating structures of the Moiré structures, wherein the second location including the second photodetector includes a location of −1 Moiré order diffraction associated with Moiré diffraction from the overlapping grating structures of the Moiré structures.

30. The overlay metrology system of claim 28, wherein the first location including the first photodetector includes a location of overlap between 0-order light and +1 Moiré order diffraction associated with Moiré diffraction from the overlapping grating structures of the Moiré structures, wherein the second location including the second photodetector includes a location of overlap between 0-order light and −1 Moiré order diffraction associated with Moiré diffraction from the overlapping grating structures of the Moiré structures.

31. The overlay metrology system of claim 30, wherein at least one of a first pitch or a second pitch of the overlapping grating structures is not resolved by the overlay metrology system.

32. The overlay metrology system of claim 28, wherein the first location including the first photodetector includes a location of overlap between +1-order diffraction from the overlapping grating structures of the Moiré structures, wherein the second location including the second photodetector includes a location of overlap between −1-order diffraction from the overlapping grating structures of the Moiré structures.

33. The overlay metrology system of claim 28, wherein the first photodetector and the second photodetector comprise:
phase-locked photodetectors locked to a frequency of the time-varying interference signals, wherein the one or more processors are further configured to execute program instructions causing the one or more processors to:
extract at least one of intensity or phase information associated with the time-varying interference signals using a phase locking technique; and
determine the overlay error between the first layer and the second layer of the sample based on the at least one of intensity or phase information.

34. The overlay metrology system of claim 28, wherein a spot size of the illumination beam on the overlay target is elongated to provide target noise averaging.

35. The overlay metrology system of claim 28, wherein the illumination beam comprises:
a spatially coherent illumination beam.

36. The overlay metrology system of claim 28, wherein the one or more cells of the overlay target comprise:
two cells including Moiré structures having periodicity along the stage-scan direction, wherein determining the overlay error between the first layer and the second layer of the sample based on the time-varying interference signals comprises:
determining the overlay error between the first layer and the second layer of the sample along the stage-scan direction based on the time-varying interference signals.

37. The overlay metrology system of claim 36, wherein the two cells comprise:
a first cell having a first Moiré structure formed as a first-layer grating on the first layer with a first pitch and a second-layer grating on the second layer with a second pitch; and
a second cell having a second Moiré structure formed as a first-layer grating on the first layer with the second pitch and a second-layer grating on the second layer with the first pitch.

38. The overlay metrology system of claim 28, wherein the one or more cells of the overlay target comprise:
two cells including Moiré structures having periodicity along the beam-scan direction, wherein determining the overlay error between the first layer and the second layer of the sample based on the time-varying interference signals comprises:
determining the overlay error between the first layer and the second layer of the sample along the beam-scan direction based on the time-varying interference signals.

39. The overlay metrology system of claim 38, wherein the two cells comprise:
a first cell having a first Moiré structure formed as a first-layer grating on the first layer with a first pitch and a second-layer grating on the second layer with a second pitch; and
a second cell having a second Moiré structure formed as a first-layer grating on the first layer with the second pitch and a second-layer grating on the second layer with the first pitch.

40. An overlay metrology system comprising:
an illumination sub-system configured to implement a metrology recipe, the illumination sub-system comprising:
a first illumination channel providing a first illumination beam;
a second illumination channel providing a second illumination beam; and
one or more deflectors to scan the first illumination beam and the second illumination beam across portions of an overlay target on a sample along a beam-scan direction as the sample is scanned along a stage-scan direction using a translation stage when implementing the metrology recipe, wherein the overlay target in accordance with the metrology recipe comprises:
a first set of cells including Moiré structures formed as overlapping grating structures with different pitches on a first layer and a second layer along the stage-scan direction; and
a second set of cells including Moiré structures formed as overlapping grating structures with different pitches on the first layer and the second layer along the beam-scan direction;
wherein the first illumination channel and the second illumination channel illuminate different cells of the overlay target separated along the beam-scan direction;
a collection sub-system configured to implement the metrology recipe, the collection sub-system comprising:
a first detection channel and a second detection channel associated with the first illumination channel and the second illumination channel, respectively, wherein a particular detection channel comprises:
a first photodetector located in a pupil plane at a first location to capture at least one of Moiré diffraction orders or overlapping diffraction orders from the Moiré structures in the overlay target when implementing the metrology recipe; and
a second photodetector located in a pupil plane at a second location to capture at least one of Moiré diffraction orders or overlapping diffraction orders from the Moiré structures in the overlay target when implementing the metrology recipe; and a controller communicatively coupled to the first photodetector and the second photodetector, the controller including one or more processors configured to execute program instructions causing the one or more processors to:
receive time-varying interference signals from the first photodetector and the second photodetector of each of the first detection channel and the second detection channel as the overlay target is scanned in accordance with the metrology recipe; and
determine an overlay error between the first layer and the second layer of the sample based on the time-varying interference signals.

41. The overlay metrology system of claim 40, wherein the first set of cells of the overlay target are distributed along the stage-scan direction and are aligned with the first illumination channel, wherein the second set of cells of the overlay target are distributed along the stage-scan direction and are aligned with the second illumination channel.

42. The overlay metrology system of claim 40, wherein the first set of cells of the overlay target are distributed along a first diagonal direction with respect to the stage-scan direction, wherein one of the first set of cells is aligned with the first illumination channel and one of the first set of cells is aligned with the second illumination channel, wherein the second set of cells of the overlay target are distributed along a second diagonal direction orthogonal to the first diagonal direction, wherein one of the second set of cells is aligned with the first illumination channel and one of the second set of cells is aligned with the second illumination channel.

43. The overlay metrology system of claim 40, wherein the first set of cells comprises:
a first cell having a first Moiré structure formed as a first-layer grating on the first layer with a first pitch and a second-layer grating on the second layer with a second pitch; and
a second cell having a second Moiré structure formed as a first-layer grating on the first layer with the second pitch and a second-layer grating on the second layer with the first pitch, wherein the second set of cells comprises:
a third cell having a third Moiré structure formed as a first-layer grating on the first layer with the first pitch and a second-layer grating on the second layer with the second pitch; and
a fourth cell having a fourth Moiré structure formed as a first-layer grating on the first layer with the second pitch and a second-layer grating on the second layer with the first pitch.

44. The overlay metrology system of claim 40, wherein the first location including the first photodetector includes a location of +1 Moiré order diffraction associated with Moiré diffraction from the overlapping grating structures of the Moiré structures, wherein the second location including the second photodetector includes a location of −1 Moiré order diffraction associated with Moiré diffraction from the overlapping grating structures of the Moiré structures.

45. The overlay metrology system of claim 44, wherein at least one of a first pitch or a second pitch of the overlapping grating structures is not resolved by the overlay metrology system.

46. The overlay metrology system of claim 40, wherein the first location including the first photodetector includes a location of overlap between 0-order light and +1 Moiré order diffraction associated with Moiré diffraction from the overlapping grating structures of the Moiré structures, wherein the second location including the second photodetector includes a location of overlap between 0-order light and −1 Moiré order diffraction associated with Moiré diffraction from the overlapping grating structures of the Moiré structures.

47. The overlay metrology system of claim 40, wherein the first location including the first photodetector includes a location of overlap between +1-order diffraction from the overlapping grating structures of the Moiré structures, wherein the second location including the second photodetector includes a location of overlap between −1-order diffraction from the overlapping grating structures of the Moiré structures.

48. The overlay metrology system of claim 40, wherein the first photodetector and the second photodetector of each of the first detection channel and the second detection channel comprise:

phase-locked photodetectors locked to a frequency of the time-varying interference signals, wherein the one or more processors are further configured to execute program instructions causing the one or more processors to:

extract at least one of intensity or phase information associated with the time-varying interference signals using a phase locking technique; and determine the overlay error between the first layer and the second layer of the sample based on the at least one of intensity or phase information.

49. The overlay metrology system of claim 40, wherein the first illumination beam has a polarization orthogonal to a polarization of the second illumination beam.

50. The overlay metrology system of claim 40, wherein the first illumination beam has a different wavelength than the second illumination beam.

51. The overlay metrology system of claim 40, wherein the first illumination beam and the second illumination beam comprise:

spatially coherent illumination beams.

\* \* \* \* \*